(12) United States Patent
Shirakawa et al.

(10) Patent No.: US 10,378,709 B2
(45) Date of Patent: Aug. 13, 2019

(54) ILLUMINATION SYSTEM FOR REPRODUCING THE COLOR TEMPERATURE RANGE OF SOLAR LIGHT FOR ILLUMINATING EXHIBITS

(71) Applicants: KABUSHIKI KAISHA TOSHIBA, Tokyo (JP); TOSHIBA MATERIALS CO., LTD., Yokohama-Shi (JP)

(72) Inventors: Yasuhiro Shirakawa, Yokohama (JP); Masahiko Yamakawa, Yokohama (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 137 days.

(21) Appl. No.: 15/712,732

(22) Filed: Sep. 22, 2017

(65) Prior Publication Data

US 2018/0010749 A1 Jan. 11, 2018

Related U.S. Application Data

(63) Continuation of application No. PCT/JP2016/059173, filed on Mar. 23, 2016.

(30) Foreign Application Priority Data

Mar. 23, 2015 (JP) ................................. 2015-059737

(51) Int. Cl.
*F21S 10/02* (2006.01)
*F21S 2/00* (2016.01)
(Continued)

(52) U.S. Cl.
CPC ................ *F21S 10/02* (2013.01); *F21K 9/64* (2016.08); *F21S 2/00* (2013.01); *H01L 33/50* (2013.01);
(Continued)

(58) Field of Classification Search
CPC ................ F21S 10/02; F21Y 2113/10; F21W 2131/304; F21K 9/64
See application file for complete search history.

(56) References Cited

U.S. PATENT DOCUMENTS

2004/0026683 A1 2/2004 Yamada et al.
2004/0264193 A1* 12/2004 Okumura ................ F21S 10/02
362/276

(Continued)

FOREIGN PATENT DOCUMENTS

EP 2 772 952 A1 9/2014
JP 2004-128444 A1 4/2004
(Continued)

OTHER PUBLICATIONS

International Search Report and Written Opinion (Application No. PCT/JP2016/059173) dated Jun. 14, 2016.

(Continued)

*Primary Examiner* — Robert J May
(74) *Attorney, Agent, or Firm* — Burr & Brown, PLLC

(57) ABSTRACT

According to one embodiment, an illumination system includes a plurality of white light sources that satisfies $-0.2 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.2$ where $P(\lambda)$ is an emission spectrum of a white light source having a specific color temperature, $B(\lambda)$ is an emission spectrum of black body radiation having a corresponding color temperature, $V(\lambda)$ is a spectrum of spectral luminous efficiency, $\lambda$ max 1 is a wavelength at which $P(\lambda) \times V(\lambda)$ becomes maximum, and $\lambda$ max 2 is a wavelength at which $B(\lambda) \times V(\lambda)$ becomes maximum. The respective white light sources have different color temperatures, and light from the respective white light sources is irradiated from different directions to a target.

15 Claims, 18 Drawing Sheets

(51) Int. Cl.
*H01L 33/50* (2010.01)
*F21K 9/64* (2016.01)
*F21Y 113/10* (2016.01)
*F21W 131/304* (2006.01)

(52) U.S. Cl.
CPC .... *F21W 2131/304* (2013.01); *F21Y 2113/10* (2016.08)

(56) References Cited

U.S. PATENT DOCUMENTS

| | | |
|---|---|---|
| 2011/0073898 A1 | 3/2011 | Van Sprang et al. |
| 2013/0100645 A1 | 4/2013 | Ooya et al. |
| 2014/0036499 A1 | 2/2014 | Yamakawa et al. |
| 2014/0246990 A1* | 9/2014 | Kim .................. H05B 33/0866 315/250 |
| 2014/0284636 A1 | 9/2014 | Yamakawa et al. |

FOREIGN PATENT DOCUMENTS

| | | |
|---|---|---|
| JP | 2009-211819 A1 | 9/2009 |
| JP | 2011-154895 A1 | 8/2011 |
| JP | 2011-523225 A1 | 8/2011 |
| JP | 2011-175783 A1 | 9/2011 |
| JP | 2014-078334 A1 | 5/2014 |
| WO | 2012/001927 A1 | 1/2012 |
| WO | 2012/144087 A1 | 10/2012 |
| WO | 2013/061942 A1 | 5/2013 |

OTHER PUBLICATIONS

Extended European Search Report (Application No. 16768816.7) dated Jul. 11, 2018.

* cited by examiner

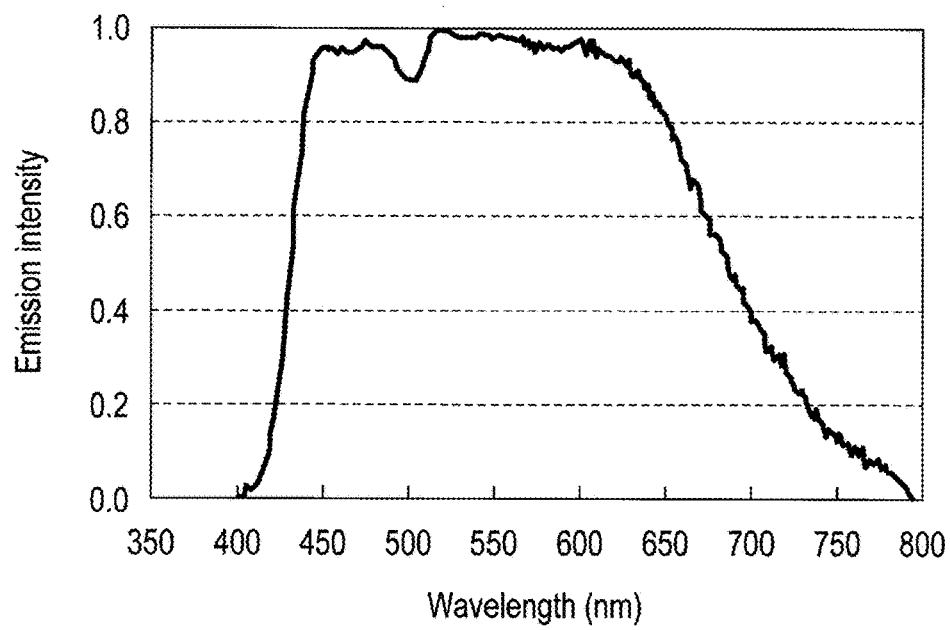
F I G. 3
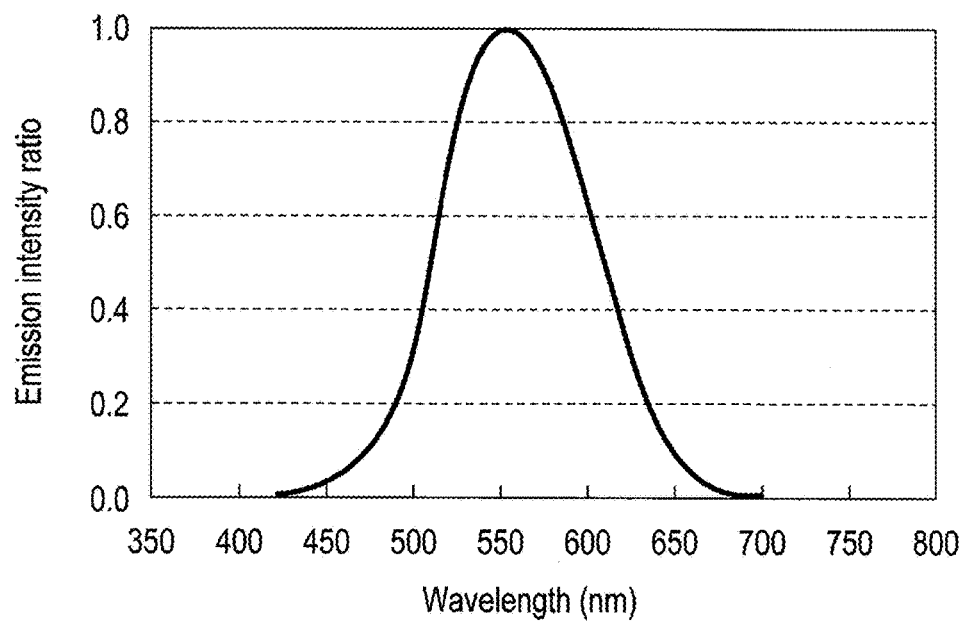
F I G. 4

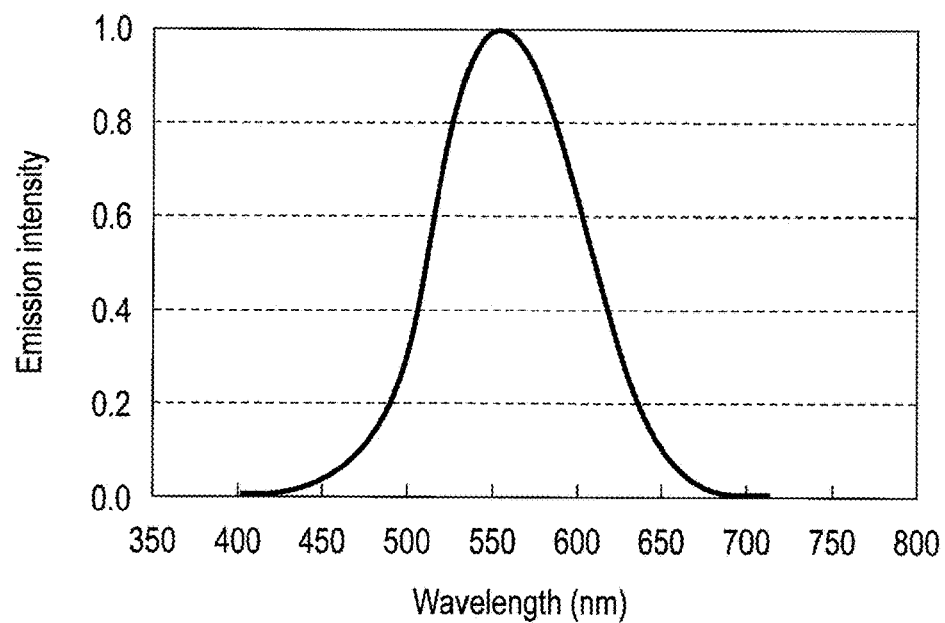
F I G. 5
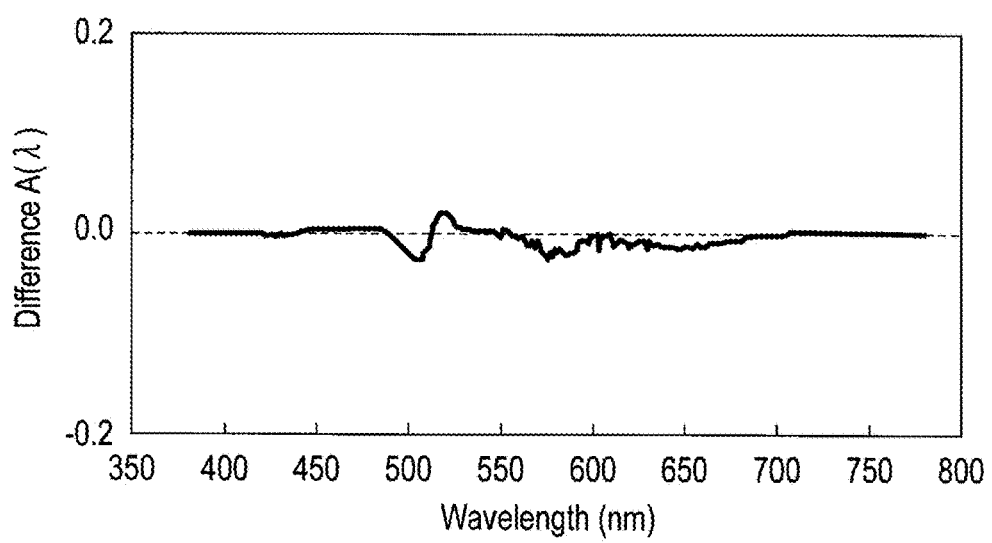
F I G. 6

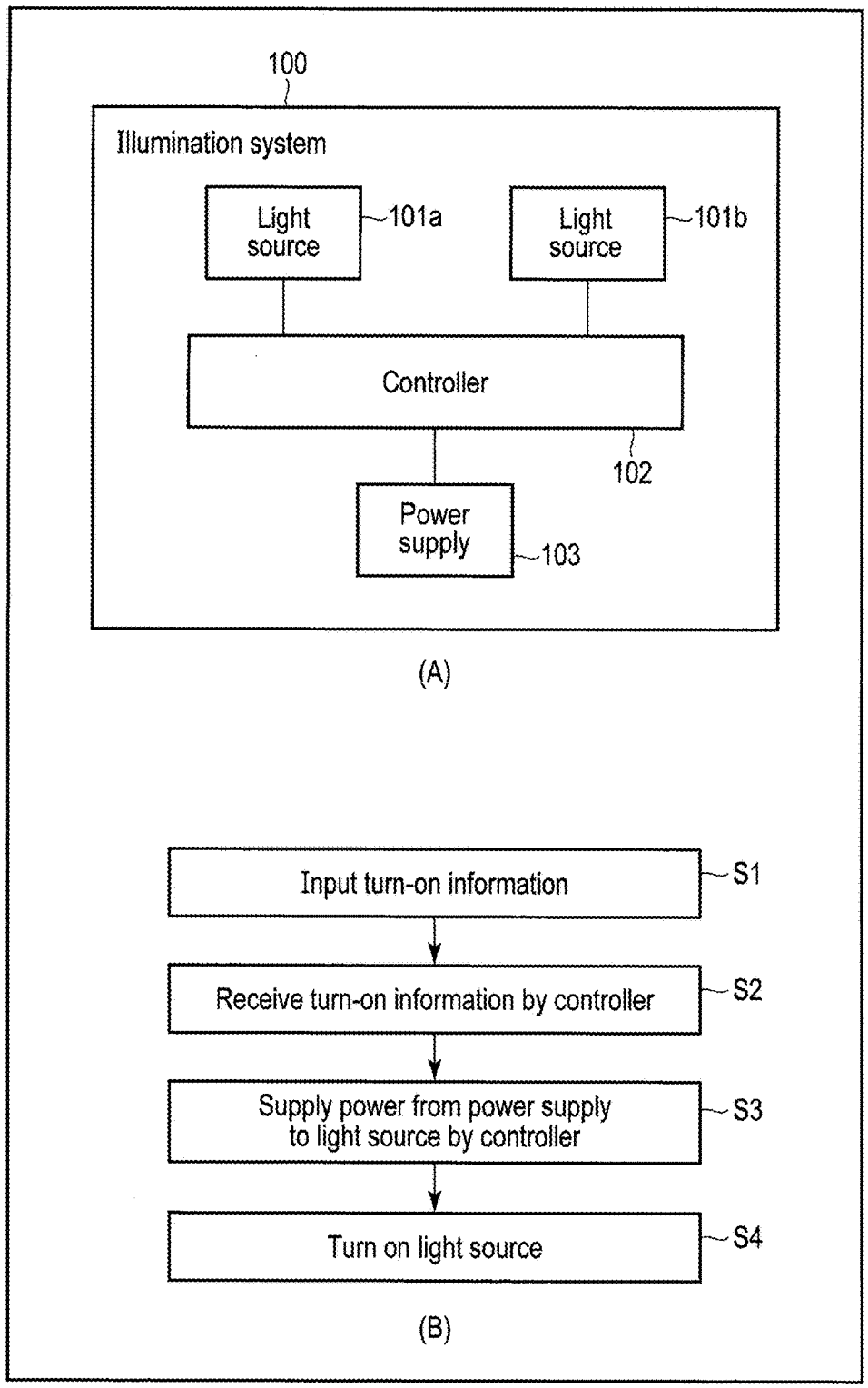
F I G. 9

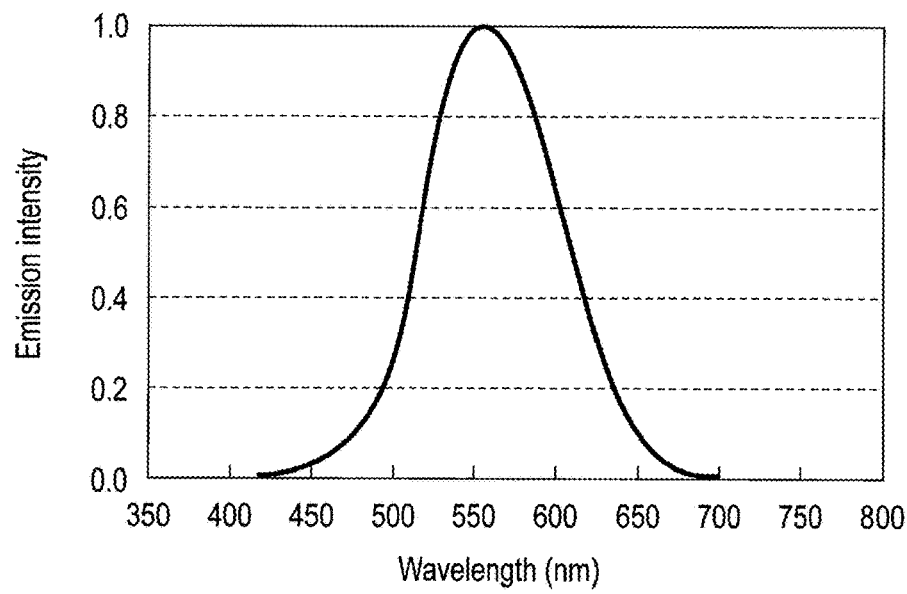
F I G. 12
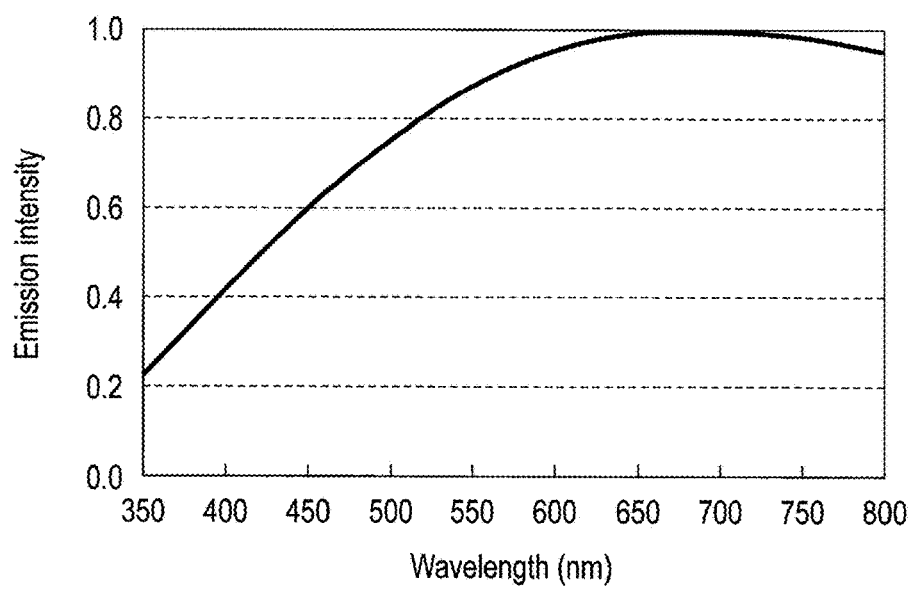
F I G. 13

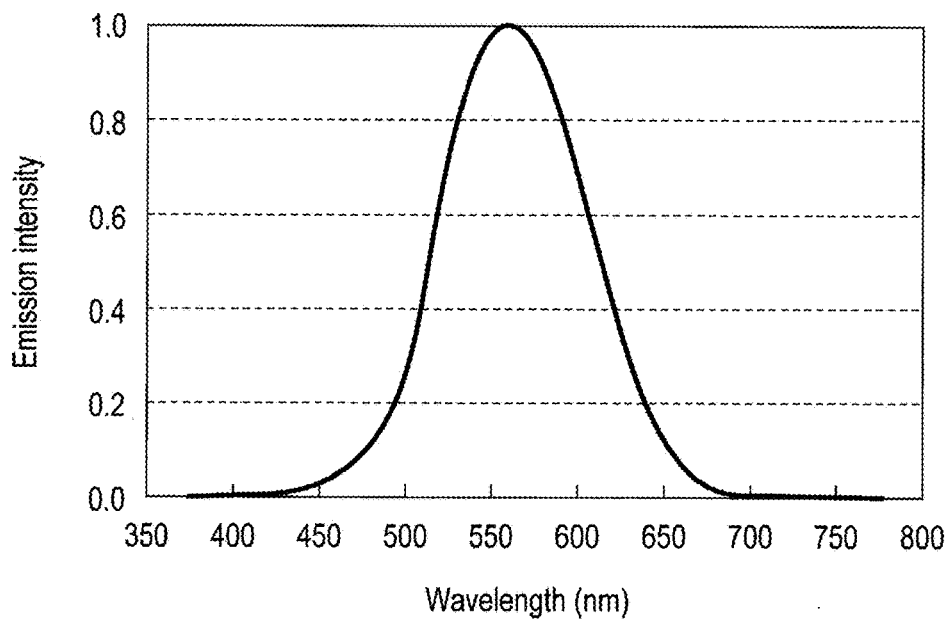
F I G. 14
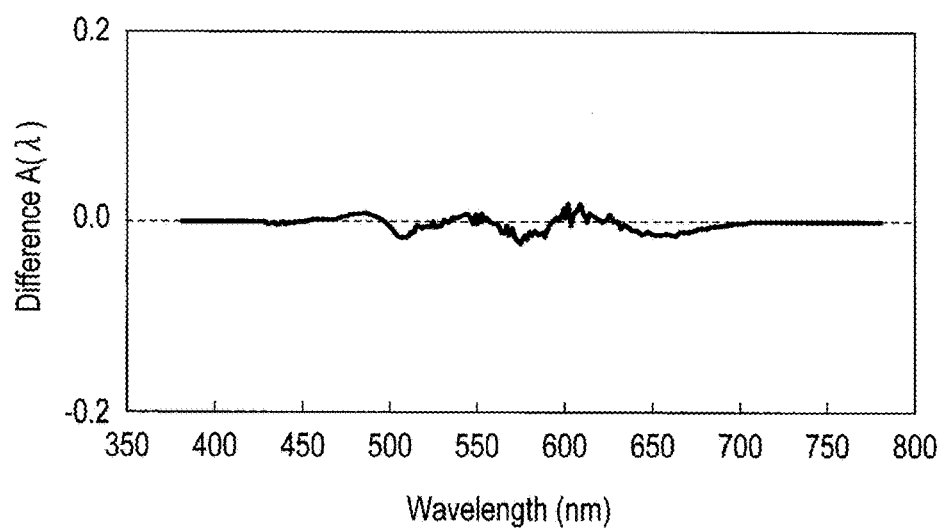
F I G. 15

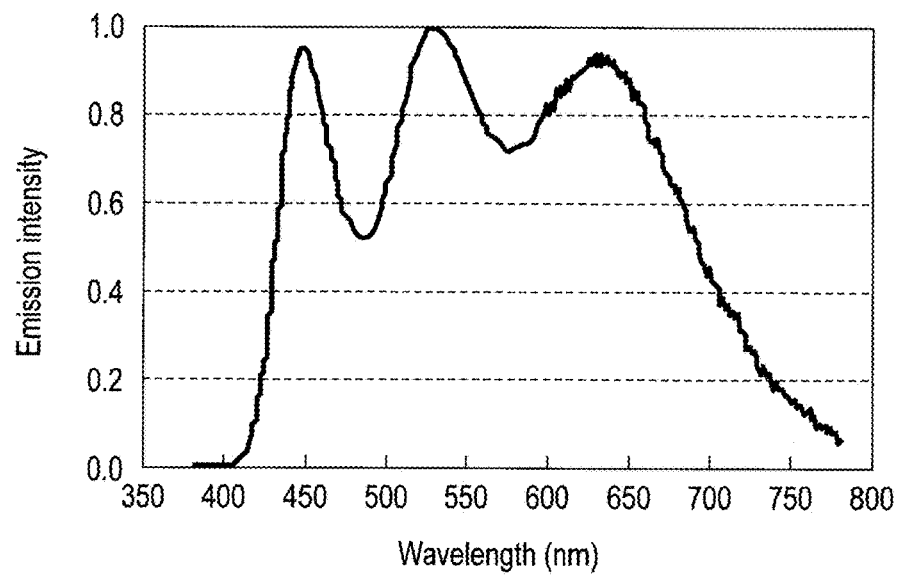
F I G. 16
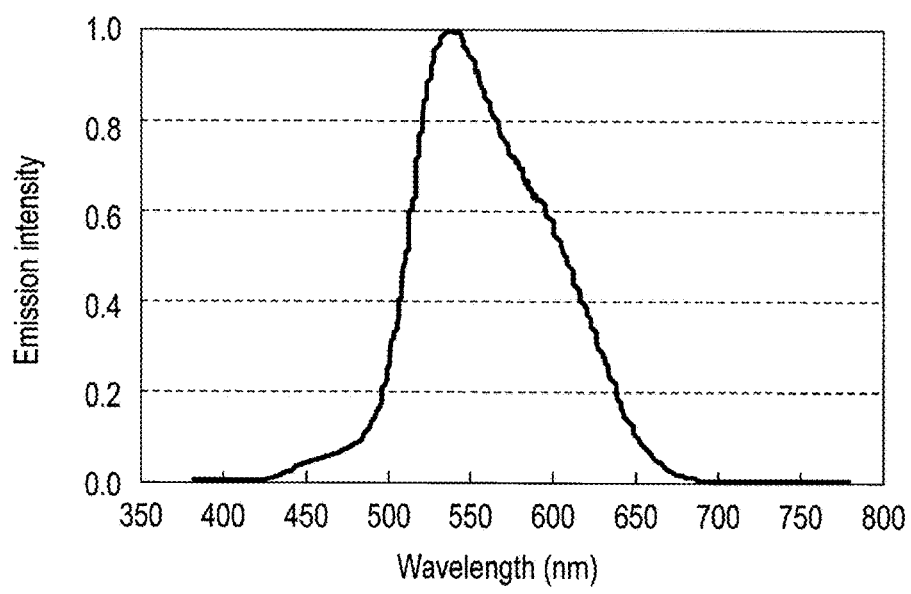
F I G. 17

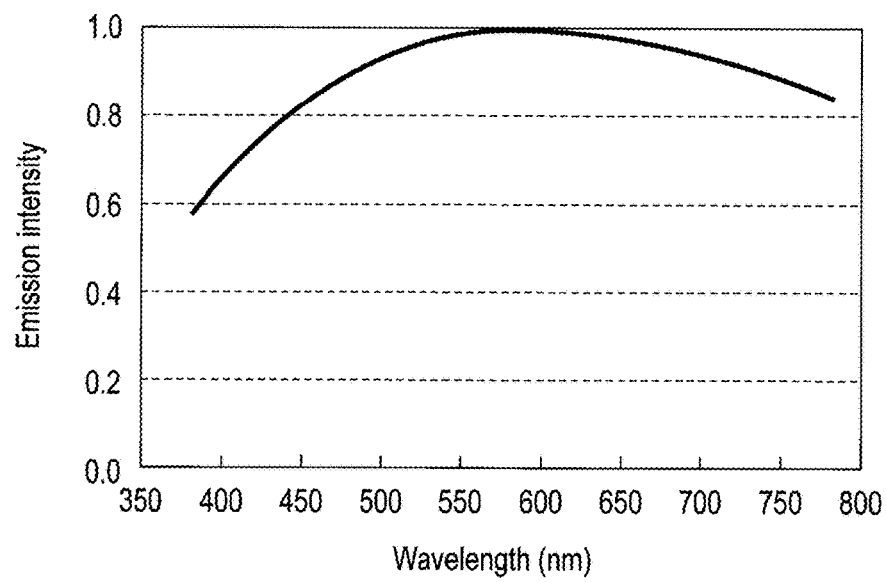
F I G. 18
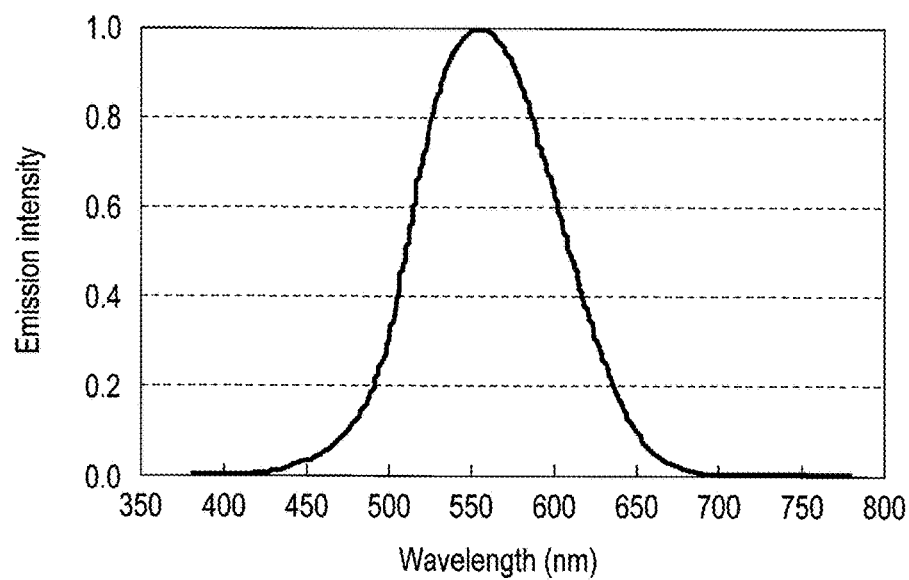
F I G. 19

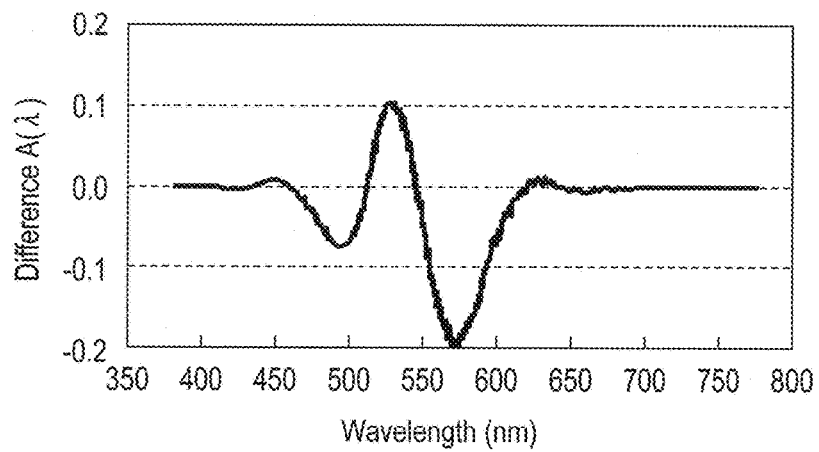
F I G. 20
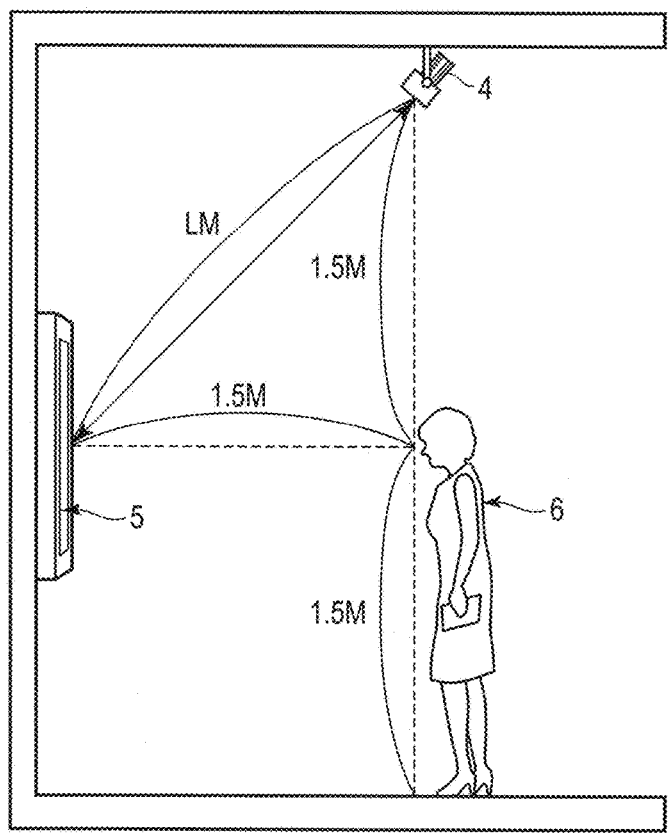
F I G. 21

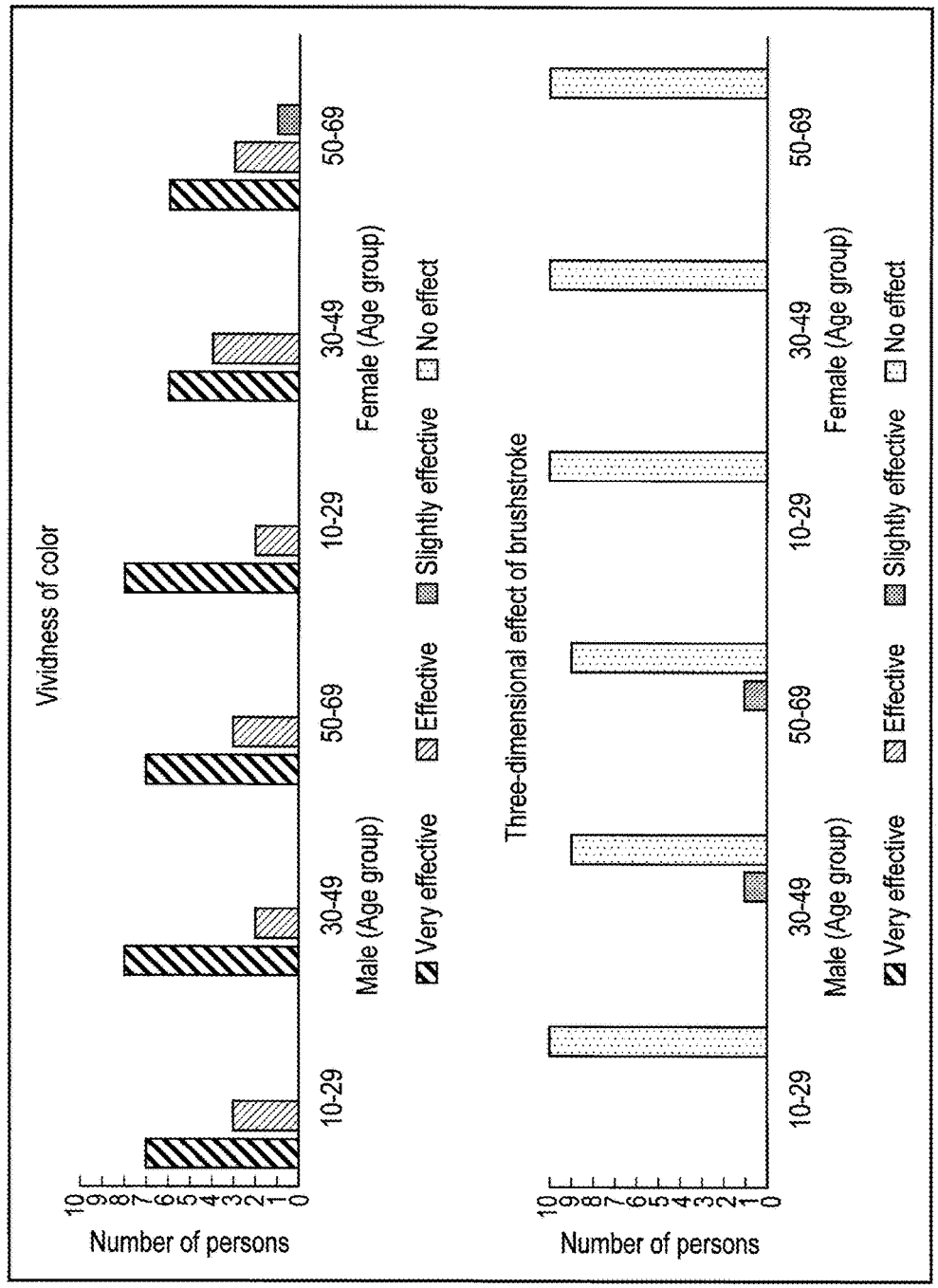
F I G. 24

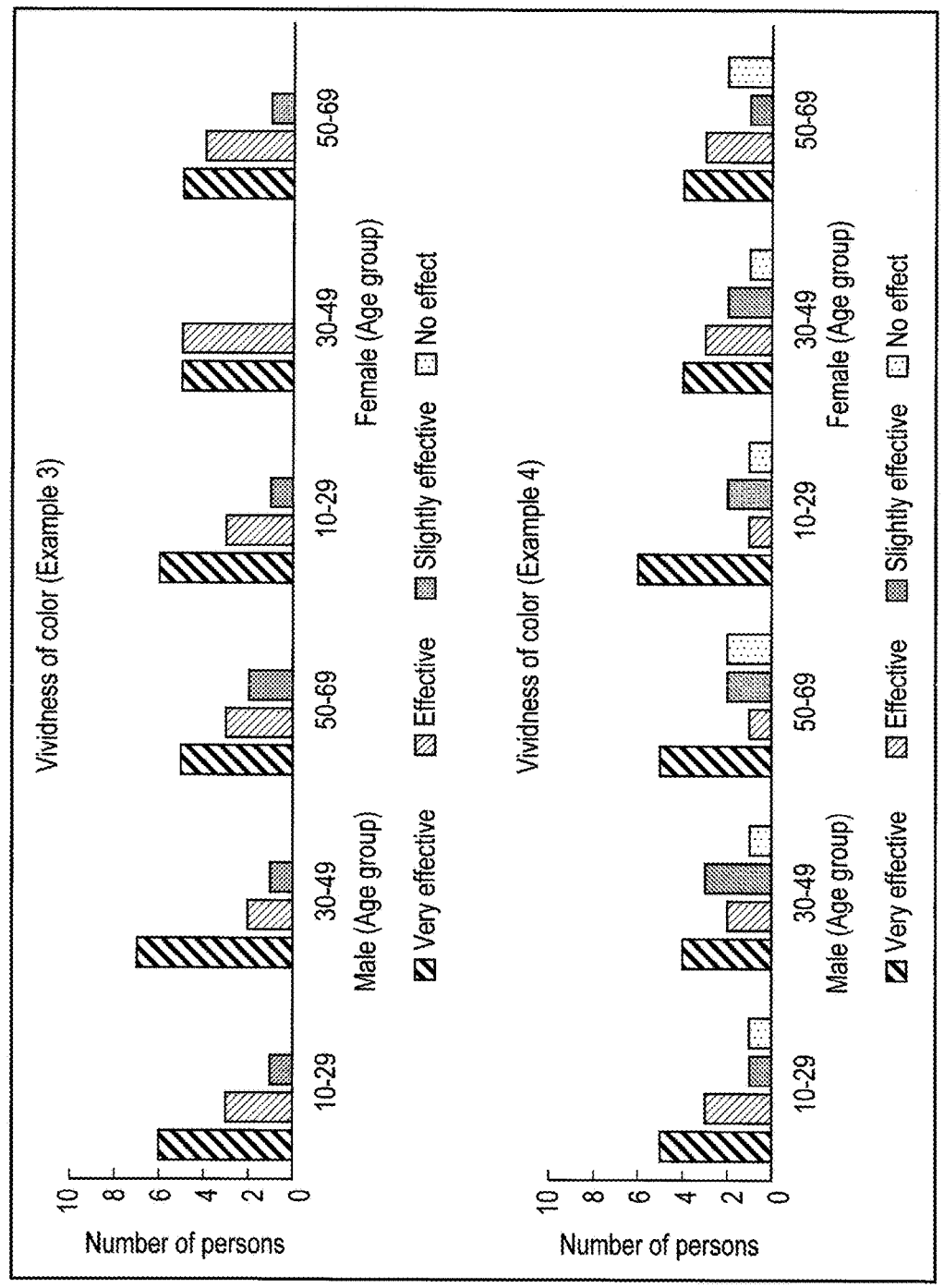
F I G. 26A

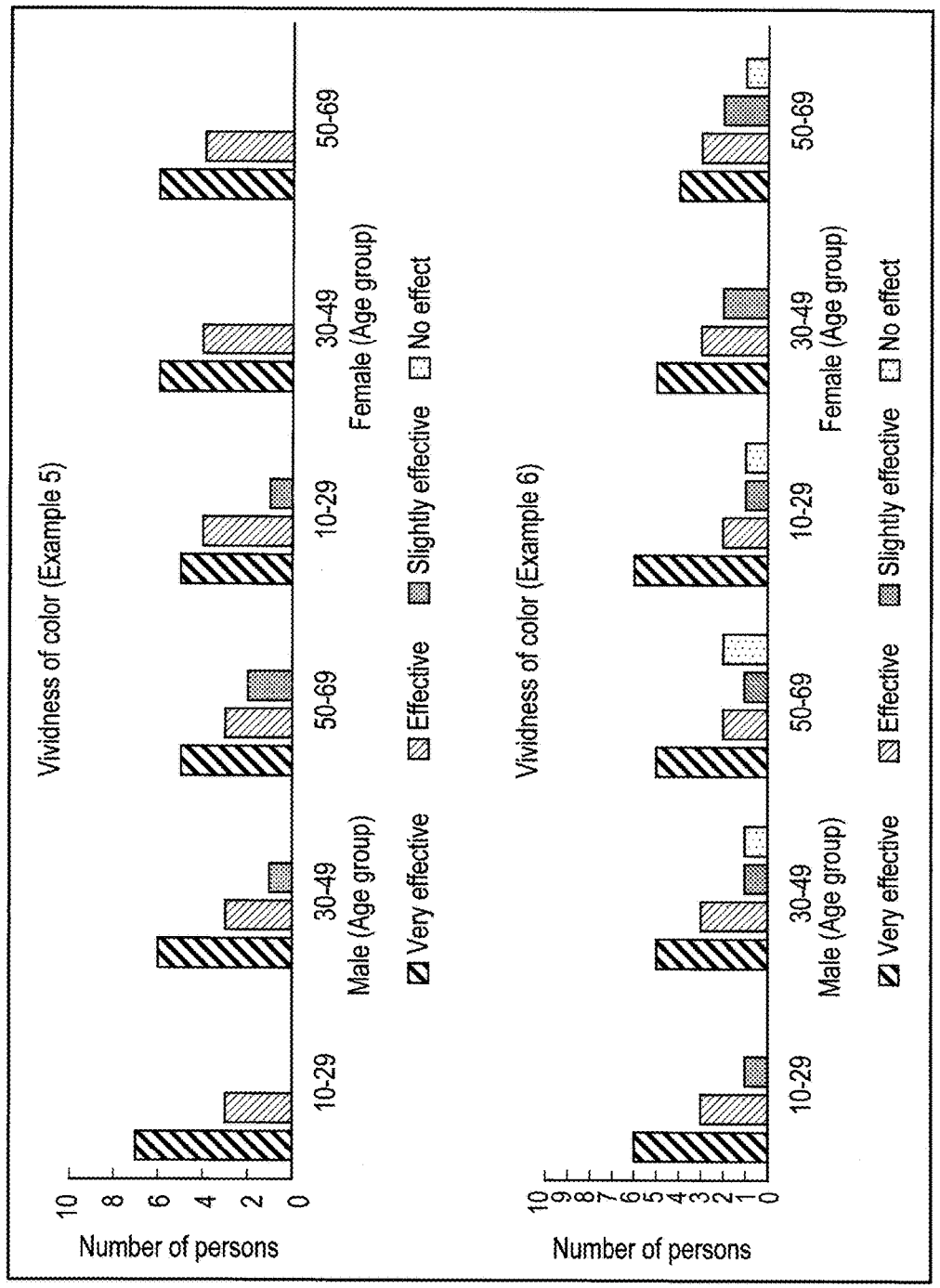
F I G. 26B

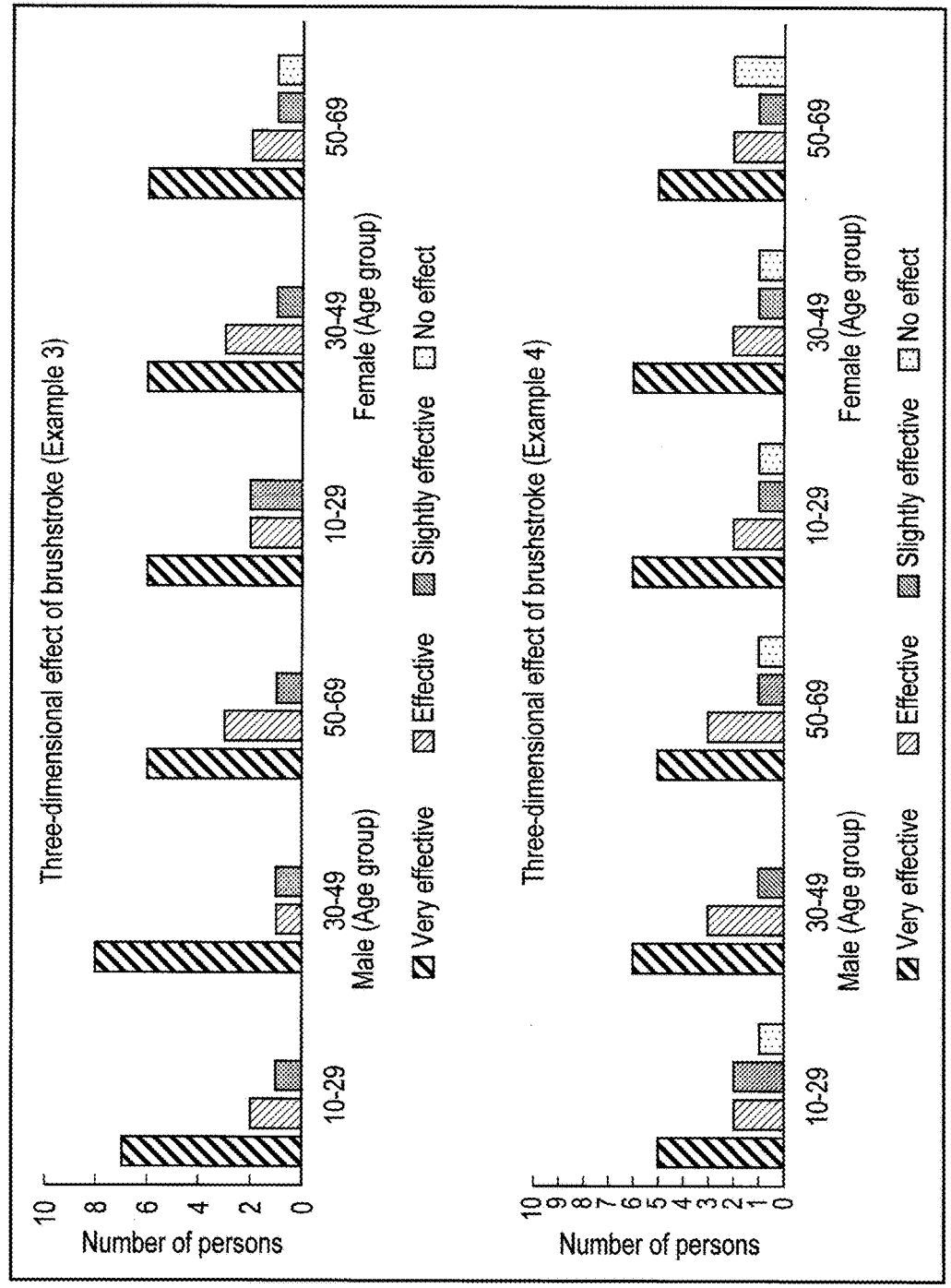
F I G. 27A

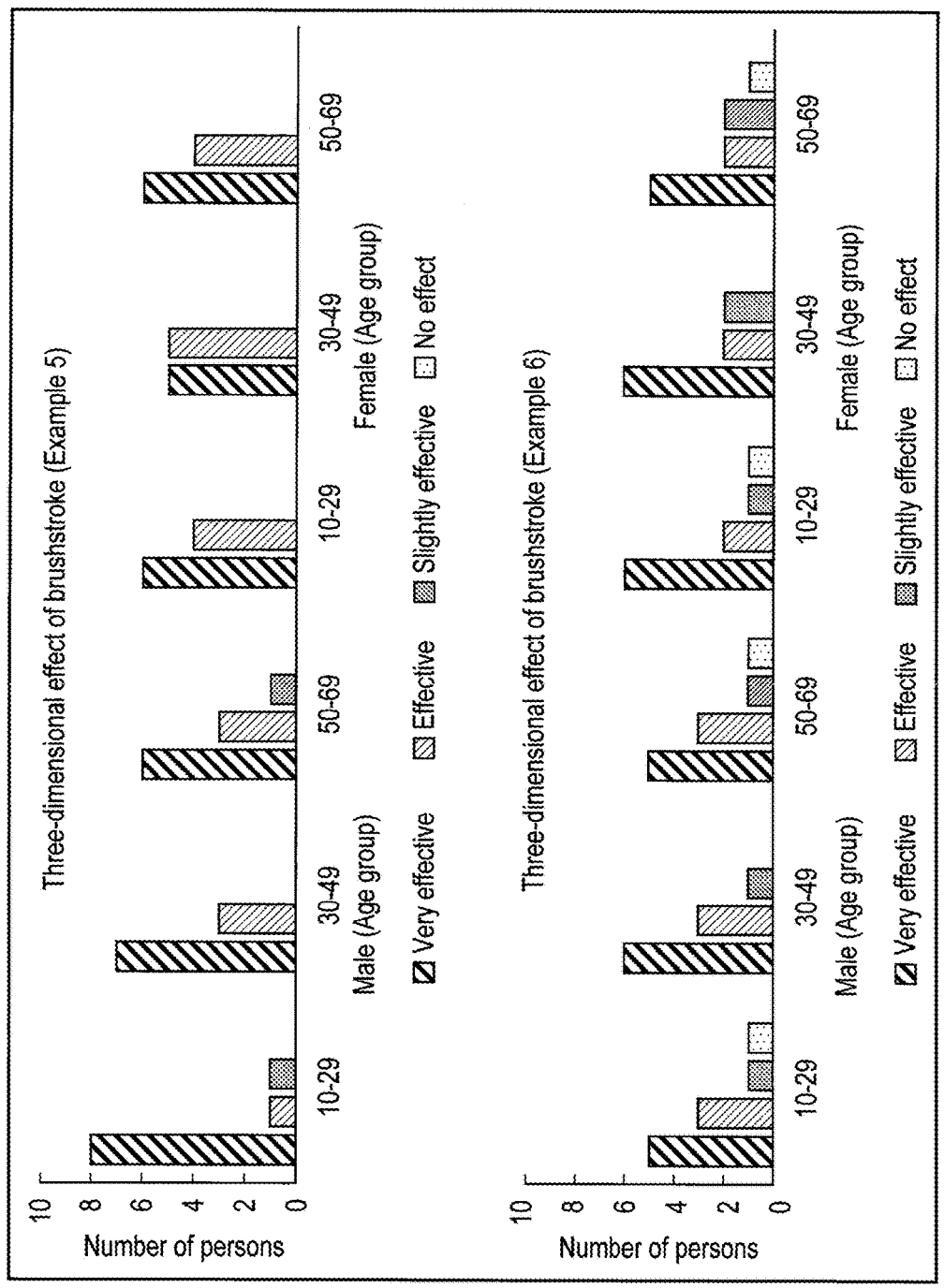
F I G. 27B

ILLUMINATION SYSTEM FOR REPRODUCING THE COLOR TEMPERATURE RANGE OF SOLAR LIGHT FOR ILLUMINATING EXHIBITS

CROSS-REFERENCE TO RELATED APPLICATIONS

This application is a Continuation Application of PCT Application No. PCT/JP2016/059173, filed Mar. 23, 2016 and based upon and claiming the benefit of priority from Japanese Patent Application No. 2015-059737, filed Mar. 23, 2015, the entire contents of all of which are incorporated herein by reference.

FIELD

Embodiments described herein relate generally to an illumination system and an illumination method used for illumination of exhibits of art galleries, museums, or the like.

BACKGROUND

In art objects or craftworks, colors of works are one of the most important characteristics, but, for example, paintings or pots are not self-luminous, and thus, illumination also has substantially the same important meaning as that of the works at the time of appreciating exhibits at art galleries, or the like. The reason is that an appreciator of the exhibit observes light reflected from a surface of the exhibit in visible light irradiated from a light source. Even though an artist expresses a beautiful color, if a light emitting component corresponding to a specific color is not included in light irradiated to the exhibit, the appreciator cannot but observe the dim exhibit with color tone insufficient in a color sense. Therefore, the light source for illumination is required to evenly include visible light of all the wavelength components so that an artist's intention can be faithfully reproduced whichever color expression the artist uses.

The most preferable light source for the illumination in above use is solar light. The solar light consists of continuous wavelength components of light, and substantially uniformly includes all the light components from 400 nm to 780 nm, which is a visible light wavelength, to be able to reproduce all the colors existing in the natural world as original colors of materials.

However, even though the solar light is excellent as a light source, it is rare that the solar light is directly used for illumination of important art objects held in the art gallery, or the like.

The reason is first that the solar light can not be artificially managed. Since light emission characteristics of the solar light are changed from moment to moment and are changed every season and every day, and the solar light cannot be used depending on weather conditions in some cases. The art gallery, or the like, is also a kind of commercial facility, and if intensity and hue of illumination in the art gallery can not be properly managed, the illumination is useless.

A more important reason is that the solar light includes visible light of all the wavelengths and also includes light emitting components other than the visible light, such as ultraviolet light or infrared light. Since the ultraviolet light or the infrared light is invisible, the ultraviolet light or the infrared light is useless for illumination, but has energy with a particular intensity as a kind of electromagnetic wave. Particularly, since the ultraviolet light has a wavelength shorter than that of the visible light and energy stronger than that of the visible light, if the ultraviolet light is irradiated to paintings, or the like, discoloration, embrittlement, or the like, of historic works is accelerated.

Therefore, if an artificial light source that does not include a harmful component such as the ultraviolet light and has the same light emitting component as that of the solar light in a visible light wavelength region can be obtained, an ideal light source can be obtained as illumination of the art gallery, or the like.

Meanwhile, a light source using a light emitting diode (LED) has attracted attention as an artificial light source in terms of energy saving and a reduction in an amount of carbon dioxide emission. A market of an LED illumination has been rapidly expanded due to a long lifespan, energy saving, and convenience as compared with a conventional incandescent lamp using a tungsten filament. Most of the original LED illuminations obtained white light by combining an LED emitting blue light and a phosphor emitting yellow light with each other, and could reproduce only an unnatural white color lacking in warmth. However, performance of LED products has been remarkably improved in accordance with market expansion of the LED products, and various improvements relating to a combination between LEDs and phosphors have been conducted. As a result, several white light sources capable of reproducing the solar light have also been developed.

International Publication No. 2012/144087, which is an invention relating to a light source having the same emission spectrum as that of solar light, reproduces solar light having different color temperatures by a black body radiation spectrum having the same color temperature. In this invention, it is possible to obtain a white light source of which a spectrum shape as well as white light in an appearance is approximated to that of solar light having various color temperatures changed with time. Next, JP 2011-154895 A is an invention relating to an illumination apparatus that can reproduce a white color on a black-body locus by mixing a white light source and a red light source with each other. Since white light obtained by such an illumination apparatus can show a high color rendering property, such an illumination apparatus can be used for illumination of food and illumination of a museum. In addition, JP 2014-078334 A is an invention improving an illumination method in order to prevent damage to exhibits, or the like, of art galleries or museums in illumination of the exhibits. Conventionally, measures could not but be taken at the expense of an illumination intensity in order to prevent deterioration of the exhibits due to illumination light. However, in this invention, it is possible to suppress physical irradiation energy for the exhibits while maintaining brightness felt by eyes by turning on LEDs in a pulse manner, such that it is possible to reduce damage to the exhibits.

BRIEF DESCRIPTION OF THE DRAWINGS

FIG. 3 is a graph illustrating an example of a spectrum of a white light source according to an embodiment corresponding to the black body radiation spectrum of FIG. 2.

FIG. 4 is a graph illustrating an example of $(P(\lambda) \times V(\lambda))/(P(\lambda\ max\ 1) \times V(\lambda\ max\ 1))$ of the white light source according to the embodiment.

FIG. 5 is a graph illustrating $(B(\lambda) \times V(\lambda))/(B(\lambda \max 2) \times V(\lambda \max 2))$ of the black body radiation of FIG. 3.

FIG. 6 is a graph illustrating an example of a differential spectrum $(P(\lambda) \times V(\lambda))/(P(\lambda \max 1) \times V(\lambda \max 1))-(B(\lambda) \times V(\lambda))/B(\lambda \max 2) \times V(\lambda \max 2))$ based on FIGS. 4 and 5.

FIG. 9 is a block diagram illustrating an example of the illumination system according to the embodiment and a flowchart illustrating a method of using the illumination system.

FIG. 12 is a graph illustrating $(P(\lambda) \times V(\lambda))/(P(\lambda \max 1) \times V(\lambda \max 1))$ of the white light source (color temperature of 4200 K) of Example 1.

FIG. 13 is a graph illustrating a black body radiation spectrum at a color temperature of 4200 K.

FIG. 14 is a graph illustrating $(B(\lambda) \times V(\lambda))/(B(\lambda \max 2) \times V(\lambda \max 2))$ of the black body radiation of FIG. 13.

FIG. 15 is a graph illustrating a differential spectrum $(P(\lambda) \times V(\lambda))/(P(\lambda \max 1) \times V(\lambda \max 1))-(B(\lambda) \times V(\lambda))/B(\lambda \max 2) \times V(\lambda \max 2))$ based on FIGS. 12 and 14.

FIG. 16 is a graph illustrating an emission spectral distribution of a white light source (color temperature of 5000 K) of Example 2.

FIG. 17 is a graph illustrating $(P(\lambda) \times V(\lambda))/(P(\lambda \max 1) \times V(\lambda \max 1))$ of the white light source (color temperature of 5000 K) of Example 2.

FIG. 18 is a graph illustrating a black body radiation spectrum at a color temperature of 5000 K.

FIG. 19 is a graph illustrating $(B(\lambda) \times V(\lambda))/(B(\lambda \max 2) \times V(\lambda \max 2))$ of the black body radiation of FIG. 18.

FIG. 20 is a graph illustrating a differential spectrum $(P(\lambda) \times V(\lambda))/(P(\lambda \max 1) \times V(\lambda \max 1))-(B(\lambda) \times V(\lambda))/B(\lambda \max 2) \times V(\lambda \max 2))$ based on FIGS. 17 and 19.

FIG. 21 is a side view illustrating an application example of the illumination system according to the embodiment.

FIG. 24 is a graph illustrating painting appreciation evaluation results by illumination of an illumination system of Comparative Example 2.

FIG. 26A is a graph illustrating painting appreciation evaluation results (vividness of color) by illumination of illumination systems of Examples 3 and 4.

FIG. 26B is a graph illustrating painting appreciation evaluation results (vividness of color) by illumination of illumination systems of Examples 5 and 6.

FIG. 27A is a graph illustrating painting appreciation evaluation results (three-dimensional effect of brushstroke) by the illumination of the illumination systems of Examples 3 and 4.

FIG. 27B is a graph illustrating painting appreciation evaluation results (three-dimensional effect of brushstroke) by the illumination of the illumination systems of Examples 5 and 6.

DETAILED DESCRIPTION

Figure 1:
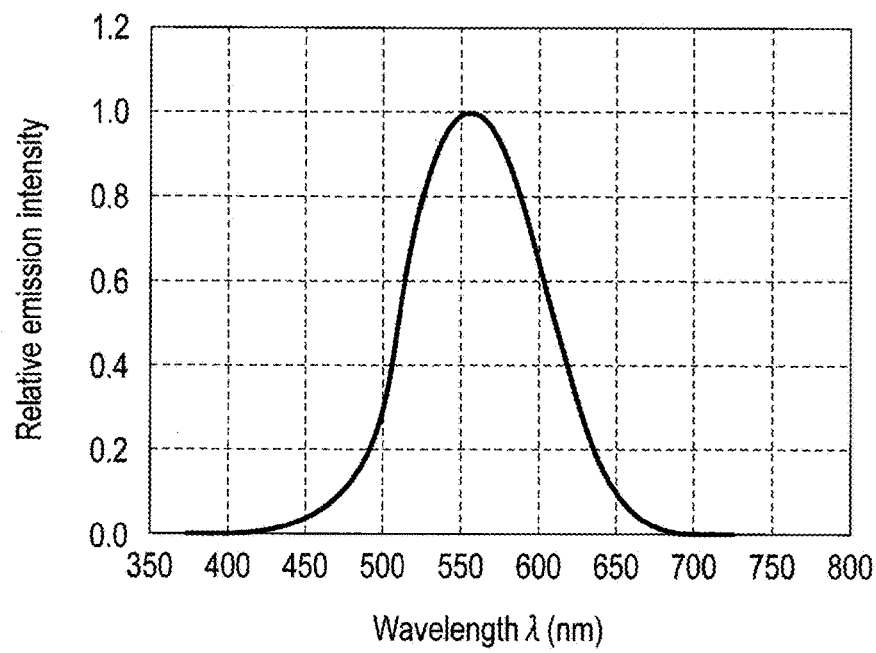
FIG. 1 is a graph illustrating a spectrum of spectral luminous efficiency.

In general, according to one embodiment, an illumination system comprises a plurality of white light sources that satisfies a relationship of $$-0.2 \leq [(P(\lambda) \times V(\lambda))/(P(\lambda \max 1) \times V(\lambda \max 1))-(B(\lambda) \times V(\lambda))/(B(\lambda \max 2) \times V(\lambda \max 2))] \leq +0.2$$

where $P(\lambda)$ is an emission spectrum of a white light source having a specific color temperature on a black-body locus, $B(\lambda)$ is an emission spectrum of black body radiation having a corresponding color temperature, $V(\lambda)$ is a spectrum of spectral luminous efficiency, $\lambda \max 1$ is a wavelength at which $P(\lambda) \times V(\lambda)$ becomes maximum, and $\lambda \max 2$ is a wavelength at which $B(\lambda) \times V(\lambda)$ becomes maximum. The respective white light sources are the white light sources that have different color temperatures, and light from the respective white light sources is irradiated from different directions to a target.

As an example of an embodiment, an illumination system including a white light source, a light emitting diode (LED) module for forming the white light source, a plurality of white light sources, and a controller controlling the plurality of white light sources will be described.

(White Light Source)

The white light source according to the embodiment basically reproduces solar light having various color temperatures. That is, in reproducing solar light having a specific color temperature, basically, a black body radiation spectrum having the same color temperature as that of the solar light is considered as an emission spectrum by the solar light, and the radiation spectrum of the white light is approximated to a shape of an emission spectral to a shape of the black body radiation spectrum. It can be thought that the sun is a kind of black body, and a radiation spectrum curve of the black body and an emission spectrum curve of the solar light are in good agreement, such that it is considered that a spectral distribution of the actual solar light is close to a black body radiation spectrum of 5800 K.

However, a color temperature of the solar light arriving at the earth is changed from moment to moment. The reason is that an altitude of the solar light seen from the earth is periodically changed daily or yearly due to an influence of rotation and revolution of the earth. Since air or moisture and various floating materials exist on the surface of the earth, until the solar light arrives at the surface of the earth, the solar light collides with various particles while passing through a floating material layer, such that light of a specific wavelength component is scattered. In this case, when an altitude of the sun seen from the earth is changed, a distance at which the solar light passes through the floating material layer is changed, and an appearance of the scattered light is changed depending on an angle, such that white light having various color temperatures periodically appears. Generally, it has been known that a color temperature of white light is approximately 2000 to 4000 K in the morning and the evening in which an altitude of the sun is low, is approximately 5000 to 6000 K at noon when an altitude of the sun is the highest, and is approximately 6000 to 7000 K in the shade or cloudy sky.

In order to reproduce the solar light having the various color temperatures as described above, in the white light source according to the embodiment, an emission spectrum approximated to a black body radiation spectrum with a color temperature range from 2000 K to 8000 K is synthesized. According to this temperature range, it is possible to almost cover a color temperature range of the solar light that can be observed on the earth. A color temperature range frequently used as an illumination light source is a range from 2200 K to 6500 K.

The black body radiation spectrum described above can be found from Planck's Equation expressed below.

$$B(\lambda) = \frac{2hc^2}{\lambda^5} \frac{1}{e^{hc/\lambda kT} - 1} \quad \text{Formula (X)}$$

Here, h is a Planck's constant, k is a Boltzmann's constant, c is a luminous flux, and e is a base of a natural logarithm. Since h, k, c, and e are fixed to predetermined numerical values, if the color temperature T is determined, a spectral distribution $B(\lambda)$ corresponding to each wavelength $\lambda$ can be easily found.

The white light source according to the embodiment is defined in detail as follows. When an emission spectrum of each white light source is $P(\lambda)$, an emission spectrum of black body radiation showing the same color temperature as that of the white light source is $B(\lambda)$, a spectrum of spectral luminous efficiency is $V(\lambda)$, a wavelength at which $P(\lambda) \times V(\lambda)$ becomes maximum is $\lambda$ max 1, and a wavelength at which $B(\lambda) \times V(\lambda)$ becomes maximum is $\lambda$ max 2, the emission spectrum of the white light source satisfies the following Equation (I):

$$-0.2 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.2 \quad (I).$$

Further, the white light source according to the embodiment satisfies the following Equation (II) in order to more strictly reproduce the emission spectrum of the black body radiation:

$$-0.1 \leq [(P(\lambda) \times V(\lambda))/(P(\lambda \text{ max } 1) \times V(\lambda \text{ max } 1)) - (B(\lambda) \times V(\lambda))/(B(\lambda \text{ max } 2) \times V(\lambda \text{ max } 2))] \leq +0.1 \quad (II).$$

The above definitions will be described in detail with reference to the drawings. FIG. 1 is a graph illustrating a spectrum of spectral luminous efficiency. It can be seen that a spectral distribution having maximum sensitivity at about 555 nm and having a symmetrical structure in a horizontal direction is illustrated as a spectral distribution corresponding to sensitivity of human eyes.

Figure 2:
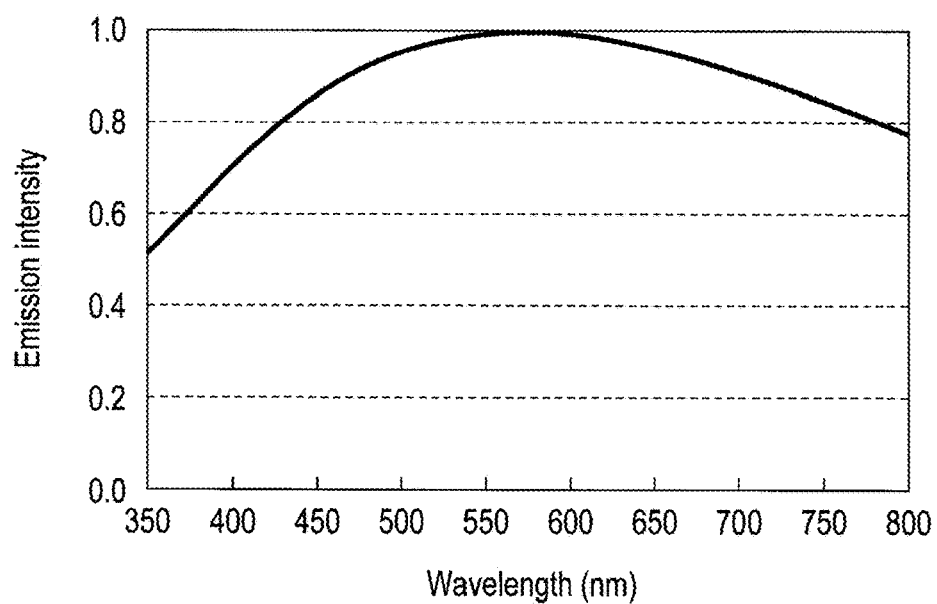
FIG. 2 is a graph illustrating a black body radiation spectrum at a color temperature of 5100 K.

FIG. 2 is a black body radiation spectrum corresponding to solar light having a color temperature of 5100 K, and FIG. 3 is an emission spectrum of a white light source according to an embodiment approximated to the black body radiation spectrum of 5100 K. When comparing FIGS. 2 and 3, it can be seen that shapes of the two emission spectra well coincide with each other in a wavelength region of 450 nm to 650 nm. In wavelengths of 450 nm or less and 650 nm or more, spectral distributions of FIGS. 2 and 3 are significantly different from each other, but these wavelength ranges are regions in which sensitivity to the human eyes does not almost exist as seen from FIG. 2 and are substantially negligible. The emission spectrum of the light source according to an example of the embodiment illustrated in FIG. 3 is a combination of emission spectra of LEDs and phosphors as described below, and can be approximated to a spectral shape of the black body radiation by appropriately mixing and adjusting emission spectra of three or more kinds of phosphors with one another.

FIGS. 4 and 5 illustrate results obtained by multiplying the emission spectra of FIGS. 2 and 3 by the spectral luminous efficiency. FIG. 4 is a spectrum diagram illustrating $(P(\lambda) \times V(\lambda))/(P(\lambda \text{ max } 1) \times V(\lambda \text{ max } 1))$ of the white light source according to an example of the embodiment, and FIG. 5 is a spectrum diagram illustrating $(B(\lambda) \times V(\lambda))/(B(\lambda \text{ max } 2) \times V(\lambda \text{ max } 2))$ of the black body radiation. In addition, FIG. 6 illustrates a differential spectrum between both spectral distributions of FIGS. 4 and 5. In detail, the differential spectrum is expressed by Equation: $(P(\lambda) \times V(\lambda))/(P(\lambda \text{ max } 1) \times V(\lambda \text{ max } 1)) - (B(\lambda) \times V(\lambda))/B(\lambda \text{ max } 2) \times V(\lambda \text{ max } 2))$. As can be seen from the differential spectrum in FIG. 6, it can be seen that a difference in spectra between the spectral distributions of FIGS. 4 and 5 is in a range of −0.03 to 0.02 and satisfies a relationship of the above Equation (II).

(LED Module)

The white light source according to the embodiment is characterized by light emission characteristics, and any constituent member may be used as long as it can reproduce solar light. For this reason, various light sources can be used, but it is preferable to use products using phosphors since a method of adjusting luminescent colors using the phosphors in order to obtain white light having various relative color temperatures is the simplest. Particularly, it is most preferable to use light sources by a combination of LEDs and phosphors since these light sources have excellent characteristics not only in terms of characteristics but also in terms of manufacturing and applications.

It is preferable to use an LED having an emission peak wavelength that is in an ultraviolet ray to violet region, specifically, in a range of 350 to 420 nm. When an LED having an emission peak wavelength exceeding 420 nm is used, the LED shows sharp light emission at a specific wavelength. Therefore, a balance between the light emission of the LED and light emission of phosphors generally having a broad spectral shape becomes bad, such that it is difficult to satisfy the relationships of the above Equations (I) and (II). In addition, when the LED is an LED emitting blue light, the blue light is excessively included, which is not preferable in terms of deterioration of pigments, or the like, and influence on the human body.

When the LED is an LED emitting ultraviolet to violet light, visibility is low, such that an influence on white light is small, and primary light from the LED is cut so as not to go to the outside of a light emitting apparatus, such that a problem such as leakage of an ultraviolet ray to the outside of the light emitting apparatus can be prevented. A kind of LEDs is not particularly limited except for the emission peak wavelength, and may be an LED emitting a laser beam, and a material of the LED may be any material.

In order for the emission spectrum of the white light source to satisfy the relationships of the above Equations (I) and (II), it is preferable to use three or more kinds, more preferably, five or more kinds of a blue phosphor, a bluish green phosphor, a green phosphor, a yellow phosphor, and a red phosphor as the phosphors combined with the LEDs. White light emission having any color temperature can be obtained by arbitrarily mixing these phosphors with one another according to the corresponding spectra of the black body radiation. Specific kinds of used phosphors may be phosphors having an emission peak of 420 to 700 nm, but are not limited thereto. For example, as phosphors excited at 350 to 420 nm, it is preferable to use the following phosphors.

An example of the blue phosphor can include a europium activated alkaline earth phosphate phosphor (having a peak wavelength of 440 to 455 nm), a europium activated barium magnesium aluminate phosphor (having a peak wavelength of 450 to 460 nm), or the like. In addition, an example of the bluish green phosphor can include a europium activated strontium aluminate phosphor (having a peak wavelength of 480 to 500 nm), europium, a manganese activated barium magnesium aluminate phosphor (having a peak wavelength of 510 to 520 nm), or the like. An example of the green phosphor can include a europium activated ortho-silicate phosphor (having a peak wavelength of 520 to 550 nm), a europium activated β sialon phosphor (having a peak wavelength of 535 to 545 nm), a europium activated strontium sialon phosphor (having a peak wavelength of 520 to 540 nm), or the like. In addition, an example of the yellow phosphor can include a europium activated ortho-silicate phosphor (having a peak wavelength of 550 to 580 nm), a cerium activated rare earth aluminum garnet phosphor (having a peak wavelength of 550 to 580 nm), a cerium activated rare earth magnesium silicon-containing garnet phosphor (having a peak wavelength of 550 to 580 nm), or the like. In addition, an example of the red phosphor can include a europium activated strontium sialon phosphor (having a peak wavelength of 600 to 630 nm), a europium activated calcium nitridoaluminosilicate phosphor (having a peak wavelength of 620 to 660 nm), a europium activated lanthanum oxysulfide phosphor (having a peak wavelength of 620 to 630 nm), a manganese activated magnesium fluoro germinate (having a peak wavelength of 640 to 660 nm), or the like.

The phosphors are mixed with a resin material to be used in a form of a fluorescent film. The fluorescent film will hereinafter be also referred to as a phosphor layer. The fluorescent film directly or indirectly covers the surrounding of an LED chip, such that primary light emitted from the LED is converted into secondary light (white light) in the fluorescent film and is then emitted to the outside of the light source. The used resin material is not particularly limited as long as it is a transparent material. However, when the LED emitting the ultraviolet light is used as the LED, it is preferable to use a silicone resin, or the like, having good deterioration resistance characteristics against the ultraviolet ray, as the resin material.

In the white light source according to the embodiment, the white light emission is obtained by a combination of phosphor light emission, it is preferable that energy of the primary light from the LED is absorbed by the phosphor as much as possible, and the leakage of the LED light to the outside of the light source needs to be avoided. Particularly, when the ultraviolet ray is included in the LED light, there is a possibility of damaging art objects, or the like, such that it is strongly required to prevent leakage of the ultraviolet ray.

In the LED module according to the embodiment, in order to prevent the leakage of the ultraviolet ray, the fluorescent film is formed to have a sufficient thick thickness. This is a fluorescent film which is formed to have the thick thickness to prevent the LED light reflected on a surface of each phosphor particle from being transmitted through the fluorescent film and being then leaked to the outside of the light source. Here, if the thickness of the fluorescent film is excessively thick, light itself from the phosphor can not be emitted to the outside of the fluorescent film, such that an emission intensity of the fluorescent film is reduced. Generally, it is known that a particle size of the phosphor and an optimum film thickness are in a proportional relationship. The fluorescent film according to the embodiment is formed to have a thickness as thick as possible using a phosphor that is particles as large as possible in practice. For such a purpose, it is preferable that an average particle size of the phosphor used in the LED module according to the embodiment is in a range of 10 μm to 40 μm. A thickness of the fluorescent film corresponding to this particle size is required to be 100 μm to 1000 μm. In this manner, it is possible to obtain the LED module that suppresses the leakage of the ultraviolet ray as much as possible without reducing the light emission of the fluorescent film as much as possible.

In addition, in order to further thoroughly prevent the leakage of the ultraviolet ray, an ultraviolet ray absorbing film may be formed outside the fluorescent film. In this case, for example, fine particle white pigments such as zinc oxide, titanium oxide, or aluminum oxide can be used as an ultraviolet ray absorbing or reflecting material. Like the fluorescent film, these fine particle pigments can be dispersed in a resin to provide an ultraviolet ray absorbing film and directly or indirectly formed outside the fluorescent film. In this manner, a desired LED module can be obtained. In the LED module according to the embodiment obtained as described above, it is possible to reduce an amount of ultraviolet ray leaked to the outside of the module to 0.4 mW/lm or less.

The numerical value of the amount of ultraviolet ray described above can be found by the following method. When the emission spectrum of the white light emitted from the light emitting apparatus is P(λ) and the spectrum of the spectral luminous efficiency is V(λ), φ is obtained by performing integration on a multiplication between P(λ) and V(λ).

$$\varphi = 683 \cdot \int P(\lambda) \cdot V(\lambda) d\lambda \quad (1)$$

The primary light energy emitted from the LED is found by integrating a spectrum F(λ) in a range of 350 to 420 nm from the following Equation to obtain UV.

$$UV = \int_{350}^{420} P(\lambda) d\lambda \quad (2)$$

The primary light energy per luminous flux of the light emitted from the light emitting apparatus can be found by UV/φ.

(Illumination System)

For example, an illumination system according to an embodiment includes a plurality of white light sources having different color temperatures in one system. The plurality of white light sources having the different color temperatures irradiate light from different directions to art craftworks, or the like, such that an improvement effect of color discriminability or boundary discriminability when appreciators appreciate the art craftworks can be obtained. Such an effect is generated since ruggedness shapes are formed on surfaces of the art craftworks or there are partial differences in properties of surfaces. For example, paintings are drawn on flat canvas, but in oil paintings, paints overlap several times according to an artist's brush usage, such that complicated ruggedness shapes are formed.

A phrase "irradiate light from different directions" means that when it is assumed that the plurality of light sources are spaced apart from a target by the same distance and are arranged on a hemisphere surrounding the target, the light is irradiated from different coordinates on the hemisphere toward the target. However, the plurality of light sources may be arranged at different distances from the target.

For example, when irradiated light is irradiated to such a painting, if white light having different color temperatures is irradiated from at least two different directions, individual illumination effects can be obtained for individual surfaces forming ruggednesses. The reason is that the respective surfaces forming the ruggednesses are formed at different angles, respectively, with respect to the illumination light sources. Here, when only one light source irradiates the light, light and darkness is generated per ruggedness and a minute shadow is formed, but when two or more light sources irradiate the light from different directions and the two or more light sources are light sources irradiating white light having different color temperatures, respectively, light reflected by the respective surfaces of ruggedness surfaces and then arriving at eyes of an appreciator of the painting has a difference in a reflection intensity per light source, and the white light having different color temperatures is thus mixed in different ratios. Therefore, the white light having different color temperatures is reflected from the respective ruggedness surfaces, such that color discriminability or boundary discriminability per ruggedness are improved.

Here, it is preferable that at least two kinds of light sources are white light sources having different color temperatures. The reason is that two different kinds of monochromatic light has a difference in an effect given to color discriminability, or the like, by a combination of art objects or light source colors, and it thus becomes impossible to reproduce original colors of the art objects. For this reason, it is preferable that the light sources are the white light source, but it is also preferable that the color temperatures of two or more kinds of white light sources are appropriately spaced apart from each other. When the color temperatures of the two or more kinds of white light sources are excessively close to each other, it is difficult to improve color discriminability even though light is irradiated from different directions to the art object. On the other hand, if the color temperatures are excessively distant from each other, there is no problem in the effect given to the color discriminability, but a difference in the color temperature between the respective light sources is excessively large, and thus, a uniform color rendering effect can not be obtained for the entire exhibit. For the above reasons, the difference in color temperature between the two kinds of white light sources is preferably 100 K to several 1000 K, more preferably 1000 K to 3000 K.

For example, the plurality of white light sources can be arranged to be spaced apart from one another by appropriate distances, respectively. In this case, an effect according to the embodiment is obtained by irradiating light by at least two kinds of white light sources having different color temperatures from different directions. Therefore, a detailed arrangement of the respective white light sources is not particularly limited. However, as there is a restriction in a structure, an exhibition method, or the like, of an art gallery, there is a range in which the effect according to the embodiment can be exerted more effectively. Hereinafter, an example of a detailed embodiment will be described.

Figure 7:
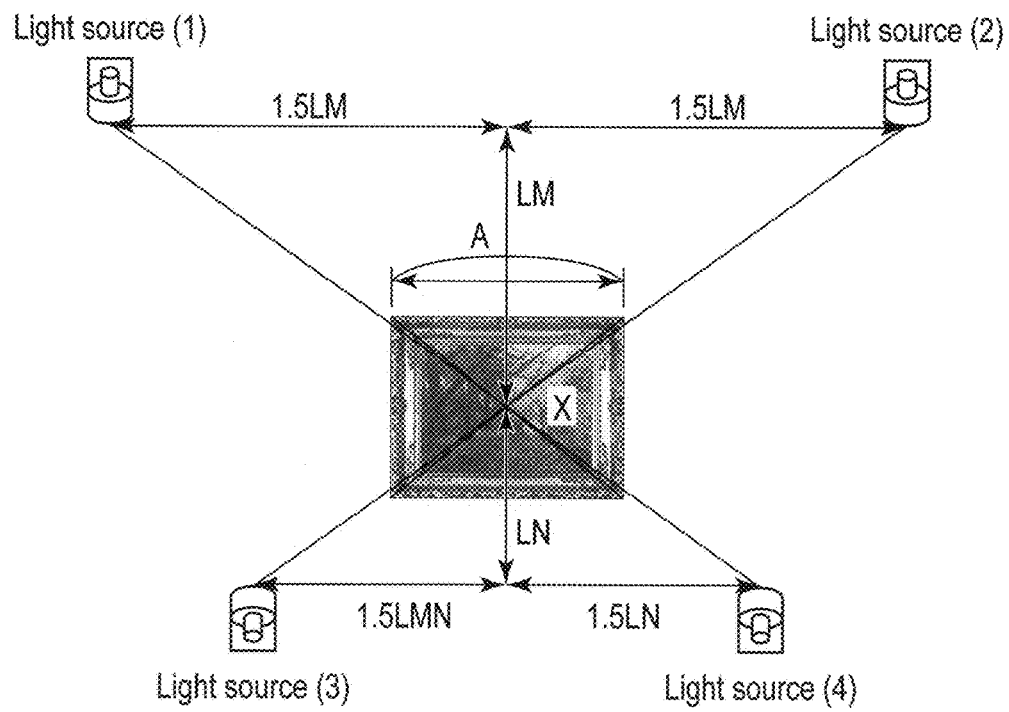
FIG. 7 is a diagram illustrating an example of an arrangement of white light sources in an illumination system according to an embodiment.

FIG. 7 is a diagram for describing an outline of an arrangement of the respective white light sources in an illumination system according to an embodiment. A rectangle illustrated in the center of FIG. 7 represents a canvas of a painting of which a length of a long side is A. An intersection point between two diagonal lines of the rectangle is defined as a plane center X. Meanwhile, a plurality of white light sources is installed at a position higher than the painting in front of the painting. Distances between the white light sources and the painting are preferably about 2 to 6 m from the plane center of the painting toward the position higher than the painting in front of the painting. Each white light source is manufactured as a light source of a spotlight, such that even though the distance between the light source and the painting is distant to some degree, the light of the white light source can arrive at the painting.

The plurality of white light sources are installed on a straight line at the position higher than the painting in front of the painting, and light sources positioned at both ends are assumed to be a light source (1) and a light source (2) (for light sources other than the light sources (1) and (2), a description in the figure will omitted). A straight line distance between a middle point on a straight line connecting the light source (1) and the light source (2) to each other and the plane center X is defined as LM. Here, in the illumination system according to the embodiment, a straight line distance L1 between any two white light sources can be a distance satisfying $0<L1\leq 3LM$. A case in which L1=0 is a case in which the respective light emitting surfaces of the plurality of light sources are in contact with each other without having a gap therebetween. The light emitting surfaces are surfaces emitting light from the white light sources. For example, a white light source in which one light emitting surface constituting one white light source is divided into a plurality of regions and light of emission spectra having different color temperatures is generated from each of the plurality of regions included in one light emitting surface can satisfy a relationship of L1=0. When the plurality of light sources as described above are used in the illumination system, the light emitted from the respective light emitting surfaces overlap as one light. Therefore, since the plurality of light sources have a configuration similar to that of a single light source, an improvement effect of color discriminability or boundary discriminability is not exerted. However, as described below, a light source in which even though one light emitting surface is divided into a plurality of regions, these regions are configured at different angles does not satisfy L1=0. When L1 is a distance exceeding 3 LM, since the distance between the light sources is excessively distant, characteristic differences between the light sources can not be effectively distinguished from each other, such that it is difficult to improve color discriminability or boundary discriminability. For example, $0.1LM \leq L1 \leq 3LM$. When $0<L1<0.1LM$, since the plurality of light sources are spaced apart from each other, an improvement effect of color discriminability or boundary discriminability can be exerted, but can be small as compared with when L1 is 0.1 LM or more. For example, the illumination system can include two light sources $A_1$ and $A_2$ at position A and three light sources $B_1$, $B_2$, and $B_3$ at position B. Both of the light sources $A_1$ and $A_2$ have a color temperature of 1000 K. All the light sources $B_1$, $B_2$, and $B_3$ have a color temperature of 2000 K. In this case, the light sources $A_1$ and $A_2$ are considered to be at the same position, that is, position A. All the light sources $B_1$, $B_2$, and $B_3$ are considered to be at position B. That is, three light sources are considered to be at the same position. In this case, L1 is a distance between a center point Am between the light source $A_1$ and the light source $A_2$ and a center point Bm of a region surrounded by the light sources $B_1$, $B_2$, and $B_3$ and including the light sources $B_1$, $B_2$, and $B_3$, that is, a distance from Am to Bm. Here, when mentioning a distance between the light sources, the distance between the light sources may be based on a distance between the center points of the light emitting surfaces included in the light sources, may be based on a distance between the farthest points of the light sources, or may be based on a distance between the closest points of the light sources. In this example, an example in which the illumination system includes light sources having the color temperatures of 1000 K and 2000 K has been described, but the color temperature is not limited thereto. In addition, the illumination system according to this example includes a group consisting of the two white light sources arranged at position A and a group consisting of the three white light sources arranged at position B. However, the number of groups including the light sources having the same color temperatures and the numbers of light sources included in the groups are not limited to those in this example.

In the illumination system described above, the white light sources irradiating the light from the position higher than the painting in front of the painting are used, but the same effect can be obtained also in a system using white light sources irradiating light from a position lower than the painting in front of painting. In FIG. 7, in addition to the white light sources installed at the position higher than the painting in front of the painting, the white light sources installed at the position lower than the painting in front of the painting are illustrated as a light source (3) and a light source (4) in the same drawing. In this case, a straight line distance (L2) between any two of the plurality of white light sources can be, for example, 0<L2≤3 LN, using a distance LN illustrated in FIG. 7.

In addition, as another embodiment of the invention, it is also possible to configure an illumination system using white light sources irradiating light from both of a position higher than a painting in front of the painting and a position lower than the painting in front of the painting. In this case, for example, as illustrated in FIG. 7, a combination of a plurality of white light sources irradiating the light from both of the position higher than the painting in front of the painting and the position lower than the painting in front of the painting may be used. Further, the same is true when white light sources positioned at the middle height rather than the position higher than the painting in front of the painting and the position lower than the painting in front of the painting also be used. In other words, in this case, light may be irradiated from the front or sides of the painting using white light sources positioned at the same height as that of the plane center of the painting. In the invention, such an illumination system and another illumination system are not distinguished from each other, and unless otherwise stated, the illumination system irradiating the light from the middle height is considered to be included in a definition of the illumination system irradiating the light from the position higher than the painting in front of the painting.

The illumination system described above shows an embodiment in which it is adopted in a relatively large art gallery, or the like. However, in a museum, a relatively small art gallery, and an individual art gallery, exhibition cases may be installed on walls or floors of rooms, and exhibits such as paintings may be received and exhibited in the exhibition cases. In such an exhibition method, in many cases, a distance between the exhibits and illumination light sources is close, such that an arrangement of white light sources also needs to be changed. In detail, when LM or LN illustrated in FIG. 7 has a value smaller than A, in the illumination system including the plurality of white light sources, it is preferable that an interval between any two white light sources is indicated by a distance considering a size of the exhibit using A illustrated in FIG. 7. The intervals (L1 and L2) may be, for example, a distance longer than 0 A, but is preferably 0.1 A or more. Since L1 and L2 are 0.1 A or more, perceived color discriminability and boundary discriminability of the exhibit can be improved. With respect to an upper limit value of the interval, since an absolute value is small, a restriction does not need to be considered due to characteristics of the illumination light sources, but when the interval is excessively large, a problem of an exhibition space occurs. Therefore, there is an upper limit value of, for example, about 10 A, depending on a space. When the exhibit is not the painting, but is a three-dimensional object like a craftwork, A illustrated in FIG. 7 is found by the following procedure.

Figure 8:
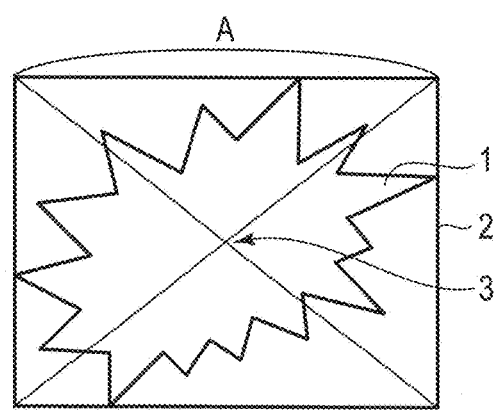
FIG. 8 is a conceptual diagram illustrating a plane center of an exhibit.

First, a two-dimensional image, that is, a front projection view, of the exhibit is drawn, a right angle quadrilateral circumscribed to a contour of the front projection view at the most points is found, and an intersection point between two diagonal lines of the right angle quadrilateral is defined as a plane center. For example, when the front projection view has a shape Y as illustrated in FIG. 8, the center point X of the right angle quadrilateral 2 circumscribed to the shape Y is the plane center of the three-dimensional exhibit. A length of one side of the right angle quadrilateral 2 in a horizontal direction, that is, A illustrated in the drawing is a distance to be found.

In addition, when the exhibit is not a plane of a three-dimensional object or a right angle quadrilateral, but is an object having an amorphous plane shape, A may be found using the same method as a method for finding the plane center of the front projection view of FIG. 8.

Here, when finding a length of A and the plane center X, the front projection view or the right angle quadrilateral of the three-dimensional exhibit does not need to be intentionally described in a drawing, or the like. The method described above explains a way of thinking. In actually arranging the light sources, the plane center may be found after drawing the front projection view and the right angle quadrilateral in the head. This is not limited to being applied to a case in which the exhibit is the three-dimensional object, but is also applied to a case in which the exhibit is a painting on a plane. In addition, it is sufficient that the position X of the plane center or the length of A are managed in a unit of cm, and higher accuracy is not necessarily required.

In addition, if the number of white light sources is two or more, the effect according to the embodiment can be exerted. However, if the number of white light sources is excessively large, a large amount of light is intensively irradiated from each direction to each surface on which ruggednesses and patterns are formed, such that white light is irradiated on all the surfaces at a uniform intensity, which is not preferable. A range in which the greatest effect is obtained is a range in which the number of white light sources is 2 or more to 5 or less. The number is applied to a case in which one light source is installed at one position, but is not applied to a case where a plurality of light sources is installed at one position. For example, when two white light sources are installed in each of the four positions, a total of eight white light sources are required.

The illumination system according to the embodiment can include, for example, the plurality of white light sources including LED modules and a controller for controlling light emission of the LED modules. The white light source can include not only the LED module, but also include a reflector, a lens, a globe for diffusing output light, and the like, if necessary. Particularly, an optical component such as the lens is an important part in focusing and irradiating illumination light on an exhibit. In addition, an envelope of the white light source can have various shapes such as a cube shape, a rectangular parallelepiped shape, a cylindrical shape, and a disc shape depending on a purpose. In addition, the white light sources may be independent from each other and may be arranged at any positions, respectively. Each white light source is electrically connected to the controller. Further, the illumination system may include an electronic circuit for controlling an emission intensity of the LED. For example, due to such a configuration, the controller can individually control emission intensities of the respective white light sources.

It is possible to irradiate mixed white light having any color temperature to the exhibit by individually changing the emission intensities of the respective white light sources. For example, when a white light source having a color temperature of 2000 K and a white light source having a color temperature of 4000 K irradiate light from different directions, white light having any color temperature between 2000 K and 4000 K can be irradiated by adjusting emission intensities of both the light sources.

However, in order to improve color discriminability or boundary discriminability, it is preferable to irradiate white light having the same intensity, if possible, from white light sources having different color temperatures. When an intensity difference between both the light sources is excessively large, an irradiation intensity of one white light source becomes significantly strong, such that there is a possibility that the meaning of irradiating the white light from two different directions will be reduced. Therefore, it is preferable that both of the emission intensities of different white light sources are adjusted to the same level. However, if a color temperature of the mixed white light source irradiated to the exhibit is always fixed to a predetermined value, such that the color temperature can not be arbitrarily changed, inconvenience may occur. In order to solve such a problem, it may be thought that each white light source and the controller are configured in a detachable structure. In addition, the plurality of white light sources each generating any color temperatures different from each other may be exchanged and used. In this case, some of the light sources may be exchanged or all the light sources may be exchanged. Alternatively, tunable light source may be used as individual white light sources. In that case, a control of the tuning may be performed by the controller, or may be performed by a tuning controller further included in the illumination system.

The illumination system according to the embodiment irradiates light to the same target at different angles using at least two kinds of white light sources consisting of a combination of LEDs emitting ultraviolet to violet light and phosphors and having different color temperatures. Therefore, if the ruggednesses due to upswelling of the paint or the material exist on the surface of the craftwork or the painting, when the light is irradiated from different directions, mixed intensities of a plurality of light are different from each other per ruggedness, such that the color discriminability or the boundary discriminability are improved, thereby making it possible to make an appearance of the target more vivid and three-dimensional. Since only color temperatures of the respective white light sources are different from each other and all the white light sources irradiate light as close to natural light as possible, the white light sources can highlight vividness while maintaining a natural texture. In this way, if it is possible to realize the illumination that makes a unique three-dimensional effect of a work prominent, a more excellent stage effect can be obtained.

In another embodiment, any one illumination system described above includes a controller. A block diagram of an example of such an illumination system 100 is illustrated in FIG. 9(A). The illumination system 100 illustrated in FIG. 9(A) is an example including the two light sources 101a and 101b as described above, a controller 102, and a power supply 104. The light source 101a and the light source 101b are electrically connected to the controller 102. The controller 102 is electrically connected to the light source 101a and the light source 101b, and the power supply 103. The controller 102 receives power supplied from the power supply 103. In this example, the power of the power supply 103 can be supplied to the light source 101a and the light source 101b through the controller 102. The controller 102 may control the supply of a current to the light source 101a and the light source 101b to control turn-on and turn-off of the light source 101a and the light source 101b and an increase and decrease in an amount of irradiated light. The controller 102 may simultaneously control all the light sources included in the illumination system or may individually control a plurality of light sources. The illumination system as described above may further have an input portion. A control of the light source 101a and the light source 101b may be performed by the controller depending on a signal from the input portion. The controller may further include a storage portion (not illustrated) for storing information such as a program and a table. For example, the controller may control the illumination system depending on the stored information. In this case, the controller may simultaneously or individually control, for example, irradiation times of the plurality of light sources, irradiation positions or directions of the plurality of light sources, or the like. The control of the irradiation positions or directions of the light sources by the controller can be performed by controlling, for example, light source construction mechanisms further included in the illumination system, for example, a motor, a rail, and/or a wire by the controller. For example, the controller can be a computer.

In the example described above, an example in which the number of light sources is two has been described, but the number of light sources is not limited thereto. In addition, the power supply 103 may be arranged for each of the light sources, or each of the light sources may have an embedded power supply. An electrical connection between the power supply and the light source may be a wireless connection or may be a wired connection. In addition, in the example described above, an example in which the supply of the power to the controller 102 is performed from the power supply 103 has been described, but the controller 102 may also have an embedded power supply such as a battery as the power supply 103. In addition, the light sources 101a and 101b may include a power supply independent of the controller 102.

A procedure for turning on light sources to a target using the illumination system as described above will be described below with reference to FIG. 9(B). First, an operator inputs turn-on information for turning on an illumination (S1). The turn-on information may be input by an input from the input portion or may be input as a program in advance. The controller receives the turn-on information (S2), and supplies the power from the power supply to the light sources depending on the turn-on information (S3). Therefore, the controller may turn on the light sources (S4). S2 and S3 may be performed depending on, for example, a program, a table, and the like. When the light sources are turned off, the operator inputs turn-off information, and the controller receives the turn-off information and blocks, for example, the supply of the power from the power supply to the light sources depending on the turn-off information to turn off the light sources.

The illumination system according to the embodiment irradiates light to the same target at different angles using at least two kinds of white light sources consisting of a combination of LEDs emitting ultraviolet to violet light and phosphors and having different color temperatures. Therefore, if the ruggednesses due to the upswelling of the paint or the material exist on the surface of the craftwork or the painting, when the light is irradiated from different directions, mixed intensities of a plurality of light are different from each other per ruggedness, such that the color discriminability or the boundary discriminability are improved, thereby making it possible to make an appearance of the target more vivid and three-dimensional. Since only color temperatures of the respective white light sources are different from each other and all the white light sources irradiate light as close to natural light as possible, the white light sources can highlight vividness while maintaining a natural texture. In this way, if it is possible to realize the illumination that makes a unique three-dimensional effect of a work prominent, a more excellent stage effect can be obtained.

In one embodiment, the irradiation of the light from different directions by the white light sources having different color temperatures described above can be performed so that, for example, a light component included in a luminous flux from a first light source and a corresponding light component included in a luminous flux from a second light source form different angles in a specific region on a surface of the target. The illumination system is an illumination system for illuminating the target. The illumination system includes at least the first light source and the second light source. These light sources may be the light sources described above. The light component included in the luminous flux from the first light source and the corresponding light component included in the luminous flux from the second light source are configured to form the different angles in the specific region on the surface of the target. The corresponding light component is a light component arriving at the same region described above. Emission spectra $P_1(\lambda)$ and $P_2(\lambda)$ of each of the first light source and the second light source have different color temperatures and satisfy conditions of the following Equations (III) and (IV), respectively:

$$-0.2 \leq [(P_1(\lambda) \times V(\lambda))/(P_1(\lambda \max 1) \times V(\lambda \max 1)) - (B_2(\lambda) \times V(\lambda))/(B_1(\lambda \max 2) \times V(\lambda \max 2))] \leq +0.2 \quad \text{(III)}$$

$$-0.2 \leq [(P_2(\lambda) \times V(\lambda))/(P_2(\lambda \max 1) \times V(\lambda \max 1)) - (B_2(\lambda) \times V(\lambda))/(B_2(\lambda \max 2) \times V(\lambda \max 2))] \leq +0.2 \quad \text{(IV)}.$$

It can be understood that the first light source and the second light source are the white light sources having the different color temperatures described above.

Figure 10:
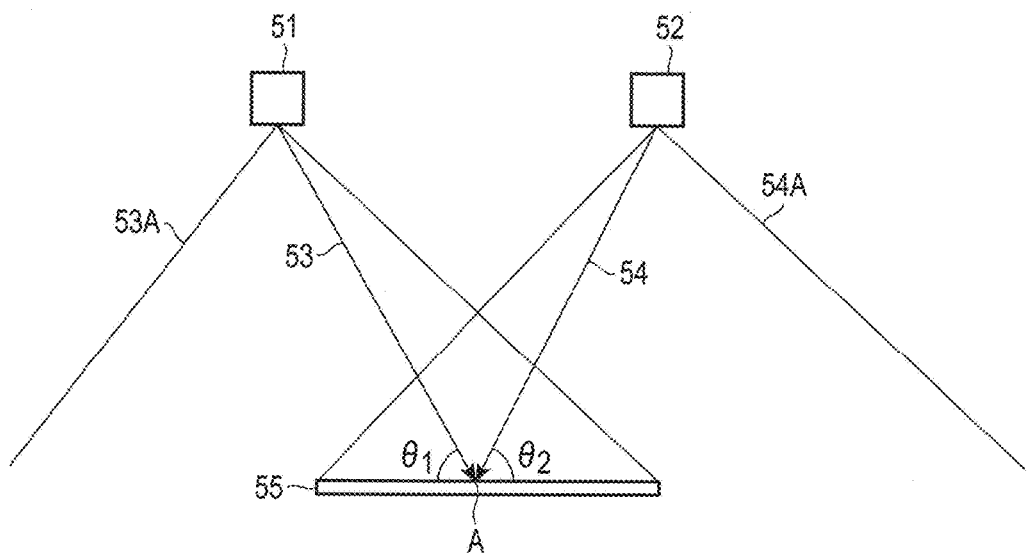
FIG. 10 is a diagram illustrating a state of using an example of the illumination system according to the embodiment.

A state of using the illumination system is illustrated in FIG. 10. For example, the illumination system of FIG. 10 includes a first light source 51 and a second light source 52. For example, the light source 51 and the light source 52 irradiate a luminous flux 53A and a luminous flux 54A, respectively, to a target, when the illumination system is used. A light component 53 and a light component 54 included in the luminous flux 53A and the luminous flux 54A, respectively, will hereinafter be mainly described. In the light component 53 and the light component 54 emitted from the light source 51 and the light source 52, respectively, the light component 53 is one light component included in the luminous flux emitted from the light source 51, and arrives at a region A of a target 55. The light component 54 is one light component included in the luminous flux emitted from the light source 52, and arrives at the region A. The light component 53 and the light component 54 arrive at the region A at different angles $\theta_1$ and $\theta_2$. Likewise, other light components from each of the light source 51 and the light source 52 can arrive at the same region on a surface of the target 55 at different angles. The light source 51 and the light source 52 may be arranged to irradiate light to the target so that the light component included in the luminous flux from the first light source and the light component included in the luminous flux from the second light source form different angles in a specific region on the surface of the target. Such an arrangement may be the same as the arrangement of the light source (1) and the light source (2) described above, or the light source 51 and the light source 52 may be closer to each other as compared with the arrangement of the light source (1) and the light source (2) described above. Alternatively, the light source 51 and the light source 52 may be configured to irradiate the light to the specific region of the target 55 at different angles using LEDs arranged on the same substrate.

In still another embodiment, the illumination system described above may further include a plurality of light sources, in addition to the first light source and the second light source described above. The first light source, the second light source, and the plurality of light sources will be called first to n-th light sources. n is an integer of 2 or more. At least two of the first to n-th light sources have different color temperatures. When n is any one integer of 2 to 5, it is more preferable that at least two to five of the first to n-th light sources have different color temperatures. The first to n-th light sources can be configured so that light components each included in luminous fluxes from each of the first to n-th light sources and corresponding to one another form different angles in a specific region on a surface of a target.

Emission spectra $P_1(\lambda)$ to $P_n(\lambda)$ of each of the first to n-th light sources satisfy a condition of Equation (V), respectively, $$-0.2 \leq [(P_r(\lambda) \times V(\lambda))/(P_r(\lambda \max 1) \times V(\lambda \max 1)) - (B_r(\lambda) \times V(\lambda))/(B_r(\lambda \max 2) \times V(\lambda \max 2))] \leq +0.2 \quad \text{(V)}$$

where $B_r(\lambda)$ is an emission spectrum of black body radiation showing the same color temperature as that of an r-th light source emitting light of $P_r(\lambda)$. Here, r is any one integer of 1 to n so as to correspond to $P_1(\lambda)$ to $P_n(\lambda)$. It can be understood that the first to n-th light sources of the emission spectra are the white light sources having the different color temperatures described above. In this case, light components from each of the first to n-th light sources (that is, the plurality of light sources) can arrive at the same region on a surface of the target at different angles.

The illumination system according to the embodiment irradiates light to the same target at different angles using at least two kinds of white light sources consisting of a combination of LEDs emitting ultraviolet to violet light and phosphors and having different color temperatures. Therefore, if the ruggednesses due to the upswelling of the paint or the material exist on the surface of the craftwork or the painting, when the light is irradiated from different directions, mixed intensities of a plurality of light are different from each other per ruggedness, such that the color discriminability or the boundary discriminability are improved, thereby making it possible to make an appearance of the target more vivid and three-dimensional. Since only color temperatures of the respective white light sources are different from each other and all the white light sources irradiate light as close to natural light as possible, the white light sources can highlight vividness while maintaining a natural texture. In this way, if it is possible to realize the illumination that makes a unique three-dimensional effect of a work prominent, a more excellent stage effect can be obtained.

EXAMPLE

Hereinafter, an effect accomplished by using an illumination system according to an embodiment for illumination of an art object, or the like, will be described in detail using Examples.

Example 1

A white light source according to an embodiment was manufactured.

A white light source was prepared by a combination of five kinds of phosphors such as a blue phosphor, a bluish green phosphor, a green phosphor, a yellow phosphor, and a red phosphor and an LED. As the LED, an LED emitting violet to ultraviolet light, having an emission peak at 400 nm was used. In addition, as the phosphors, a europium activated alkaline earth phosphate blue phosphor having a peak wavelength of 445 nm, a europium activated strontium aluminate bluish green phosphor having a peak wavelength of 490 nm, a europium activated ortho-silicate green phosphor having a peak wavelength of 530 nm, a europium activated ortho-silicate yellow phosphor having a peak wavelength of 555 nm, and a europium activated strontium sialon red phosphor having a peak wavelength of 630 nm were prepared. The respective phosphors were mixed with one another in a weight ratio of blue phosphor:bluish green phosphor:green phosphor:yellow phosphor:red phosphor=10:15:25:20:30. An LED module was prepared using each phosphor by applying a phosphor slurry in which powders having an average particle size of 30 to 35 μm are dispersed in a silicone resin so as to cover an LED chip placed on a substrate. A thickness of a fluorescent film was about 750 μm.

Figure 11:
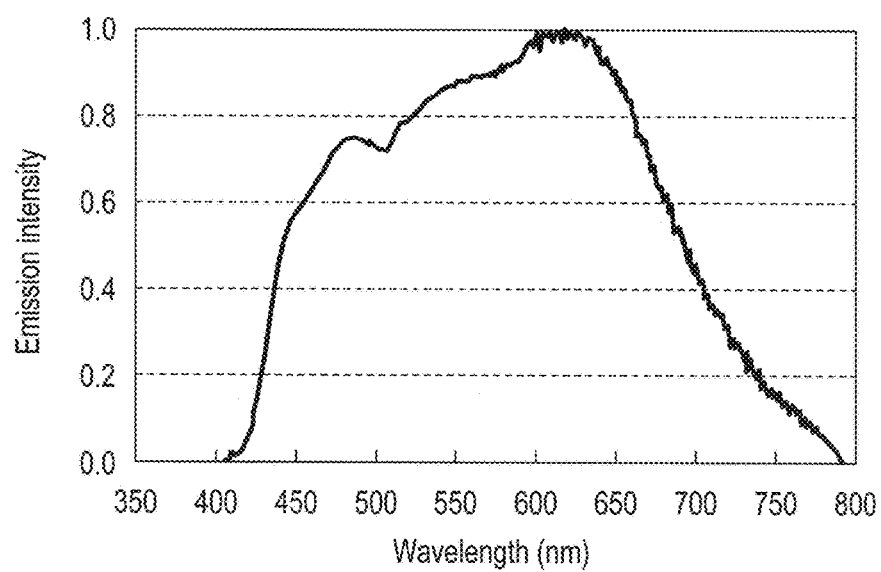
FIG. 11 is a graph illustrating an emission spectral distribution of a white light source (color temperature of 4200 K) of Example 1.

Then, light emission characteristics of the LED module were measured using a total luminous flux measuring instrument including an integrating sphere according to JIS-C-8152. A color temperature of the white light source was 4200 K, and an emission spectral distribution of the white light source was as illustrated in FIG. 11. In addition, $(P(\lambda) \times V(\lambda))/(P(\lambda \text{ max } 1) \times V(\lambda \text{ max } 1))$ of Example 1 found using the spectral luminous distribution $V(\lambda)$ of FIG. 2 was illustrated in FIG. 12. Meanwhile, a corresponding black body radiation spectrum having a color temperature of 4200 K was as illustrated in FIG. 13, and similarly, when $(B(\lambda) \times V(\lambda)/(B(\lambda \text{ max } 2) \times V(\lambda \text{ max } 2)$ is found, a curved line of FIG. 14 could be obtained. In addition, as a differential spectrum $\{P(\lambda) \times V(\lambda)/(P(\lambda \text{ max } 1) \times V(\lambda \text{ max } 1))-(B(\lambda) \times V(\lambda)/B(\lambda \text{ max } 2) \times V(\lambda \text{ max } 2)\}$ between FIGS. 12 and 14, a curved line illustrated in FIG. 15 could be obtained. It could be seen from the curved line of FIG. 15 that the differential spectrum is distributed within a range of −0.04 to −0.03, such that the relationship of the above Equation (II): $-0.1 \leq [(P(\lambda) \times V(\lambda))/(P(\lambda \text{ max } 1) \times V(\lambda \text{ max } 1))-(B(\lambda) \times V(\lambda))/(B(\lambda \text{ max } 2) \times V(\lambda \text{ max } 2))] \leq +0.1$ is satisfied.

An LED spotlight was prepared by installing a reflector, a lens, an envelope, and the like, in the LED module and additionally connecting an electronic circuit to the LED module and was used as the white light source according to the embodiment. Luminous efficiency of the spotlight was 65 lm/W, an intensity of the primary light of the LED leaked from the white light source was 0.11 mW/lm, and it was proved that there was no problem in an intensity of a leaked ultraviolet ray.

Example 2

As a white light source according to an embodiment, a white light source having a color temperature different from that of the white light source according to Example 1 was manufactured.

A white light source was prepared by a combination of three kinds of phosphors such as a blue phosphor, a green phosphor, and a red phosphor and an LED. As the LED, an LED emitting violet to ultraviolet light, having an emission peak at 410 nm was used. In addition, as the phosphors, a europium activated alkaline earth phosphate blue phosphor having a peak wavelength of 445 nm, a europium activated ortho-silicate green phosphor having a peak wavelength of 530 nm, and a europium activated calcium nitridoaluminosilicate red phosphor having a peak wavelength of 625 nm were prepared. The respective phosphors were mixed with one another in a weight ratio of blue phosphor:green phosphor:red phosphor=31:30:29. An LED module was prepared using each phosphor by applying a phosphor slurry in which powders having an average particle size of 34 to 38 μm are dispersed in a silicone resin so as to cover an LED chip placed on a substrate. A thickness of a fluorescent film was about 930 μm.

Then, light emission characteristics of the LED module were measured using the total luminous flux measuring instrument. A color temperature of the white light source was 5000 K, and an emission spectral distribution of the white light source was as illustrated in FIG. 16. In addition, $(P(\lambda) \times V(\lambda))/(P(\lambda \text{ max } 1) \times V(\lambda \text{ max } 1))$ of Example 2 found using the spectral luminous distribution $V(\lambda)$ of FIG. 2 was illustrated in FIG. 17. Meanwhile, a corresponding black body radiation spectrum having a color temperature of 5000 K was as illustrated in FIG. 18, and similarly, when $(B(\lambda) \times V(\lambda))/(B(\lambda \text{ max } 2) \times V(\lambda \text{ max } 2)$ is found, a curved line of FIG. 19 could be obtained. In addition, as a differential spectrum $\{(P(\lambda) \times V(\lambda))/(P(\lambda \text{ max } 1) \times V(\lambda \text{ max } 1))-(B(\lambda) \times V(\lambda))/B(\lambda \text{ max } 2) \times V(\lambda \text{ max } 2)\}$ between FIGS. 17 and 19, a curved line illustrated in FIG. 18 could be obtained. It could be seen from the curved line of FIG. 18 that the differential spectrum is distributed within a range of −0.2 to −0.1, such that the relationship of the above Equation (I): $-0.2 \leq [(P(\lambda) \times V(\lambda))/(P(\lambda \text{ max } 1) \times V(\lambda \text{ max } 1))-(B(\lambda) \times V(\lambda))/(B(\lambda \text{ max } 2) \times V(\lambda \text{ max } 2))] \leq +0.2$ is satisfied.

An LED spotlight was prepared by installing a reflector, a lens, an envelope, and the like, in the LED module and additionally connecting an electronic circuit to the LED module and was used as the white light source according to the embodiment. Luminous efficiency of the spotlight was 65 lm/W, an intensity of the primary light of the LED leaked from the white light source was 0.08 mW/lm, and it was proved that there was no problem in an intensity of a leaked ultraviolet ray.

Examples 3 to 7 and Comparative Examples 1 to 3

Illumination systems including a plurality of white light sources were prepared. The illumination systems were prepared by preparing white light sources by LED spotlights and connecting the respective spotlights to a controller. Adjustment of turn-on/off or emission intensities of each white light source could be controlled in a centralized manner by the controller. Directions of each light source were adjusted so that light is irradiated from each light source toward a plane center of an exhibit, and emission intensities of each light source were adjusted so that illuminance of the plane center of the exhibit would be 200 lux.

The emission intensities of each light source can be individually changed, but in Examples and Comparative Examples, emission intensities of all the light sources were adjusted to be approximately the same as one another and were provided for appreciation.

Figure 22:
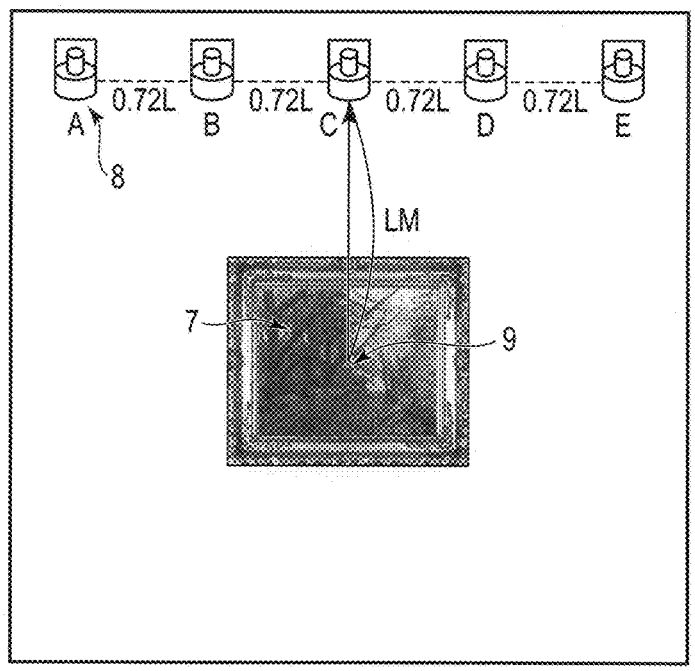
FIG. 22 is a front view illustrating an application example of the illumination system according to the embodiment.

As the exhibit, an oil painting having of a size 1 m×1 m was prepared. A position relationship among an exhibit space, an illumination light source, and an appreciator was as illustrated in FIG. 21 (side view) and FIG. 22 (front view). The painting was installed on a wall of 1.5 m from a floor. The white light sources were attached to a ceiling portion above a position forward spaced apart from the wall by a distance of 1.5 m, like A to E in FIG. 21 (white light sources 4 in FIG. 19). When five white light sources are used, they were installed at positions A, B, C, D, and E, respectively, when three white light sources are used, they were installed at positions A, C, and E, respectively, and when two white light sources are used, they are installed at positions A and E or B and D, respectively. A distance LM between a middle point on a straight line connecting the white light source A and the white light source E to each other and the plane center of the painting in the case in which the five white light sources are arranged was calculated to be LM=$(1.5^2+1.5^2)^{1/2}$=2.1 (m) using numeral values in the drawing. In addition, when a distance between the five light sources is expressed using L1, a distance between both ends A and E of the white light sources was 2.88 LM and a distance between the respective white light sources was 0.72 LM. In addition, in Comparative Examples, as an example, illumination systems in which five white light sources are arranged at equal intervals of 8 cm (=0.04 L) around position C were prepared. An appreciator 6 of a painting is assumed to stand at a position spaced apart from the front of the painting 5 by about 1.5 m, as illustrated in the drawing.

As the white light sources, the following types of LED spotlights were prepared.

The white light source (white light source 1) having the color temperature of 4200 K, prepared in Example 1, the white light source (white light source 2) having the color temperature of 5000 K, prepared in Example 2, and three types of white light sources (white light sources 3, 4, and 5) manufactured by the same method as those of Examples 1 and 2 and having different color temperatures of 5600 K, 6200 K, and 6800 K, respectively, were prepared, and a total of five types of white light sources according to embodiments having different color temperatures were prepared. In addition, for comparison, a commercially available high color rendering type lamp (conventional light source 1) was also prepared. The conventional light source 1 is a light source of which only luminescent chromaticity is adjusted to a color temperature of 5000 K on a black-body locus and an emission spectrum shape is not approximated to a black body radiation spectrum of the same color temperature. An average color rendering index (Ra) of this white light source was 90. In the white light sources according to the embodiment, an Ra value of the white light source 1 was 98, and an Ra value of the white light source 2 was 97. In addition, all the Ra values of the white light sources according to the embodiment including the other white light sources 3 to 5 were 96 or more. In the illumination system according to the embodiment, the five types of white light sources were appropriately combined with one another and used.

Types or positions of white light sources were variously changed to prepare illumination systems of Examples 3 to 7 and Comparative Examples 1 to 3, as illustrated in Table 1.

TABLE 1

|  | Number of light sources | Types of light source | Position of light source | Distance between light sources m (L1) |
| --- | --- | --- | --- | --- |
| Example 3 | 2 | White light source 1 | A | 6.06 (2.88 LM) |
|  |  | White light source 2 | E |  |
| Example 4 | 2 | White light source 1 | B | 3.02 (1.44 LM) |
|  |  | White light source 2 | D |  |
| Example 5 | 3 | White light source 2 | A | 3.02 (1.44 LM) |
|  |  | White light source 3 | C |  |
|  |  | White light source 4 | E |  |
| Example 6 | 5 | White light source 1 | A | 1.51 (0.72 LM) |
|  |  | White light source 2 | B |  |
|  |  | White light source 3 | C |  |
|  |  | White light source 4 | D |  |
|  |  | White light source 5 | E |  |
| Example 7 | 5 | White light source 1 | C | 0.08 (0.04 LM) |
|  |  | White light source 2 | C |  |
|  |  | White light source 3 | C |  |
|  |  | White light source 4 | C |  |
|  |  | White light source 5 | C |  |
| Comparative Example 1 | 3 | Conventional light source 1 | A | 3.02 (1.44 LM) |
|  |  | Conventional light source 2 | C |  |
|  |  | Conventional light source 3 | E |  |
| Comparative Example 2 | 3 | White light source 3 | A | 3.02 (1.44 LM) |
|  |  | White light source 3 | C |  |
|  |  | White light source 3 | E |  |
| Comparative Example 3 | 5 | White light source 3 | C | 0.08 (0.04 LM) |
|  |  | White light source 3 | C |  |
|  |  | White light source 3 | C |  |
|  |  | White light source 3 | C |  |
|  |  | White light source 3 | C |  |

In order to confirm an effect of the illumination system according to the embodiment, a painting appreciation experiment was performed by 60 test subjects. The test subjects were ten males and ten females of each of three age groups of 10 to 29 years old, 30 to 49 years old, and 50 to 69 years old, and were healthy subjects having visual acuity of 1.0 or more.

Figure 23:
FIG. 23 is a painting used for evaluating the illumination system.

As an art object for confirming the effect, a landscape, which is an oil painting illustrated in FIG. 23, was used. The test subjects were asked to confirm an appearance of this painting with respect to vividness of colors and a three-dimensional effect of brushstrokes under illuminations by various systems. With respect to the vividness of the colors, the test subjects were asked to pay attention to a blue color of the sky spreading in a background, a red color or a yellow color of flowers growing beside a road, a deep green color of backgrounds of flowering plants, a bright green color of a lawn, a brown color of trees spreading over an entire surface of the painting, and the like, and evaluate how clearly these colors are distinguished from one another and look vivid. In addition, with respect to the three-dimensional effect, the test subjects were asked to evaluate how clearly individual recoated strokes of the flowering plant, the trees, or the like, are distinguished from one another and look three-dimensional, regardless of technique such as perspective, or the like.

The evaluations were performed by the following procedure. The test subjects were first asked to appreciate the painting for 10 seconds by an illumination method to be compared and were then asked to appreciate the painting for 10 seconds by an illumination method to be evaluated, which is immediately switched from the illumination method to be compared. With respect to the illumination method to be evaluated for the illumination method to be compared, the test subjects were asked to write difference levels in a four-grade evaluation. In detail, four grades were Very Effective (⊚), Effective (○), Slightly Effective (Δ), and No Effect (×). In a procedure of the evaluations, illuminations to be compared and illuminations to be evaluated were necessarily switched repeatedly, and only the illuminations to be evaluated were not continuously evaluated. Therefore, evaluation results were a relative evaluation for each comparison standard, and all the evaluation results in this case can not be evaluated with one another by the same standard.

First, with respect to illumination systems according to Comparative Examples 1 to 3, effects were confirmed for a difference in an appearance. Comparison results between Comparative Example 1 and Comparative Example 2 were arranged in Table 2 and FIG. 24. Numerals in Table 2 indicate the number of persons who selected each evaluation rank. As can be seen from a description of FIG. 24 and Table 2, since the white light sources used in the illumination system according to Comparative Example 2 are the same as those used in the illumination system according to the embodiment, it was recognized that the illumination system according to Comparative Example 2 has an improvement effect of a color rendering property and has a clear improvement effect of vividness of colors of the painting as compared with the illumination system according to Comparative Example 1 using the conventional light sources. However, since all the light sources used in both of Comparative Example 1 and Comparative Example 2 are the white light sources having the same color temperature, a difference in a three-dimensional effect of the painting between Comparative Example 1 and Comparative Example 2 was not recognized.

TABLE 2

| Evaluator | | Vividness of color | | | | Three-dimensional effect of brushstroke | | | |
|---|---|---|---|---|---|---|---|---|---|
| | | ⊚ | ○ | Δ | X | ⊚ | ○ | Δ | X |
| 10 to 29 years old | Male | 7 | 3 | 0 | 0 | 0 | 0 | 0 | 10 |
| | Female | 8 | 2 | 0 | 0 | 0 | 0 | 0 | 10 |

TABLE 2-continued

| Evaluator | | Vividness of color | | | | Three-dimensional effect of brushstroke | | | |
|---|---|---|---|---|---|---|---|---|---|
| | | ⊚ | ○ | Δ | X | ⊚ | ○ | Δ | X |
| 30 to 49 years old | Male | 8 | 2 | 0 | 0 | 0 | 0 | 1 | 9 |
| | Female | 6 | 4 | 0 | 0 | 0 | 0 | 0 | 10 |
| 50 to 69 years old | Male | 7 | 3 | 0 | 0 | 0 | 0 | 1 | 9 |
| | Female | 6 | 3 | 1 | 0 | 0 | 0 | 0 | 10 |

Figure 25:
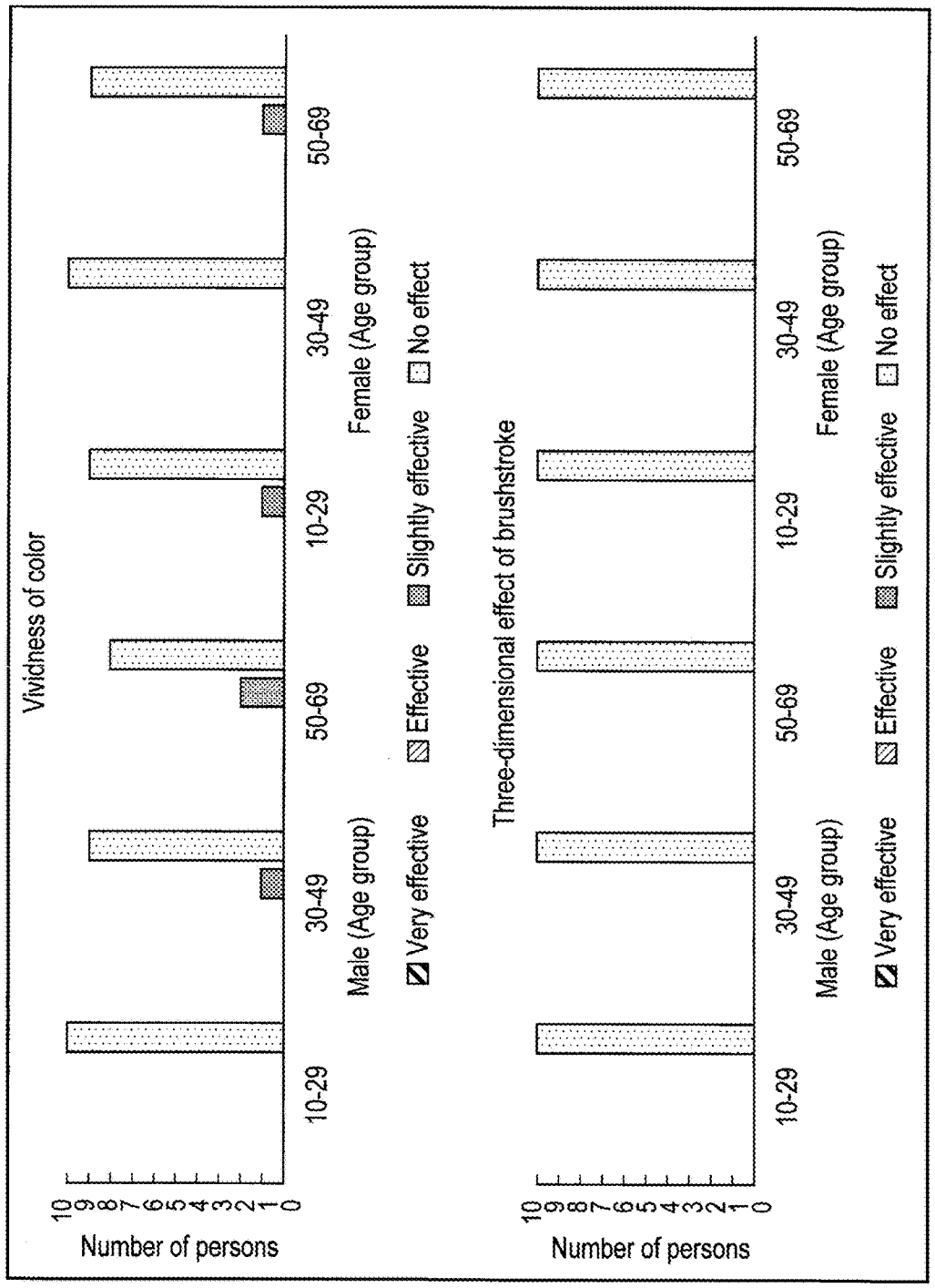
FIG. 25 is a graph illustrating painting appreciation evaluation results by illumination of an illumination system of Comparative Example 3.

An appearance of the painting in the case of using the illumination system according to Comparative Example 3 was evaluated based on the white light source system according to Comparative Example 2. Results were as illustrated in Table 3 and FIG. 25. There was no person who recognized an improvement effect of a three-dimensional effect of brushstrokes. There were several persons who recognized a slight effect on vividness of colors, but it seems that the persons who felt the vividness of the colors since the entire painting was brightly illuminated due to an increase in the number of light sources. However, the three-dimensional effect of the brushstrokes was not recognized since stronger light was irradiated from the same portions. Although not appearing in data, it was thought that a negative effect is stronger for the three-dimensional effect of the brushstrokes as compared with Comparative Example 2.

TABLE 3

| Evaluator | | Vividness of color | | | | Three-dimensional effect of brushstroke | | | |
|---|---|---|---|---|---|---|---|---|---|
| | | ⊚ | ○ | Δ | X | ⊚ | ○ | Δ | X |
| 10 to 29 years old | Male | 0 | 0 | 0 | 10 | 0 | 0 | 0 | 10 |
| | Female | 0 | 0 | 1 | 9 | 0 | 0 | 0 | 10 |
| 30 to 49 years old | Male | 0 | 0 | 1 | 9 | 0 | 0 | 0 | 10 |
| | Female | 0 | 0 | 0 | 10 | 0 | 0 | 0 | 10 |
| 50 to 69 years old | Male | 0 | 0 | 2 | 8 | 0 | 0 | 0 | 10 |
| | Female | 0 | 0 | 1 | 9 | 0 | 0 | 0 | 10 |

Next, an appearance of the painting was compared for the illumination systems according to Example 3 to Example 7, based on the illumination system according to Comparative Example 2. Results were arranged in Table 4 and FIGS. 26A, 26B, 27A, and 27B. With respect to an evaluation method, the painting was appreciated for 10 seconds using the illumination system according to Comparative Example 2 and was then appreciated using the illumination system according to Example 3, and a difference in the appearance of the painting was evaluated. In Examples 4 to 7, the same process as that of Example 3 was repeated, and confirmation of a comparison standard was necessarily performed using the illumination system according to Comparative Example 2 immediately before appreciating the painting in each Example.

Improvement effects were obviously recognized in terms of vividness of colors and a three-dimensional effect in the painting irradiated with the light by the illumination system according to Examples 3 to 6 as compared with the painting irradiated with the light by the illumination system according to Comparative Example 2. There are some appreciators who evaluated that there is "No Effect", but 90% or more of all the appreciators judged that there is "Any Effect, and 70% or more of all the appreciators admitted to be "Effective", such that effects of the illumination system according to the embodiment were clearly recognized. In addition, a difference in an effect between Examples was not so large, but better results tended to be obtained when a distance between the light sources becomes long to be a predetermined distance or more or the number of the illumination light sources was not increased so much. When the illumination system according to Example 7 is used, there was no remarkable effect unlike the other Examples, but persons (the number of persons of A or more) who recognized as having any effect have a majority, such that it could be judged that there is an illumination effect. Particularly, a ratio of persons who recognized as having an effect in a three-dimensional effect of brushstrokes is higher than that of persons who recognized as having an effect in vividness of colors.

TABLE 4

| | | | Vividness of color | | | | Three-dimensional effect of brushstroke | | | |
|---|---|---|---|---|---|---|---|---|---|---|
| | Evaluator | | ⊚ | ○ | Δ | X | ⊚ | ○ | Δ | X |
| Example 3 | 10 to 29 years old | Male | 6 | 3 | 1 | 0 | 7 | 2 | 1 | 0 |
| | | Female | 6 | 3 | 1 | 0 | 6 | 2 | 2 | 0 |
| | 30 to 49 years old | Male | 7 | 2 | 1 | 0 | 8 | 1 | 1 | 0 |
| | | Female | 5 | 5 | 0 | 0 | 6 | 3 | 1 | 0 |
| | 50 to 69 years old | Male | 5 | 3 | 2 | 0 | 6 | 3 | 1 | 1 |
| | | Female | 5 | 4 | 1 | 1 | 6 | 2 | 1 | 1 |
| Example 4 | 10 to 29 years old | Male | 5 | 3 | 1 | 1 | 5 | 2 | 2 | 1 |
| | | Female | 6 | 1 | 2 | 1 | 6 | 3 | 1 | 0 |
| | 30 to 49 years old | Male | 4 | 2 | 3 | 0 | 6 | 2 | 1 | 1 |
| | | Female | 4 | 3 | 2 | 2 | 6 | 3 | 1 | 1 |
| | 50 to 69 years old | Male | 5 | 1 | 2 | 2 | 6 | 2 | 1 | 2 |
| | | Female | 4 | 3 | 1 | 0 | 5 | 1 | 1 | 0 |
| Example 5 | 10 to 29 years old | Male | 7 | 3 | 0 | 0 | 5 | 4 | 1 | 0 |
| | | Female | 5 | 4 | 1 | 0 | 8 | 3 | 0 | 0 |
| | 30 to 49 years old | Male | 6 | 3 | 1 | 0 | 6 | 5 | 0 | 0 |
| | | Female | 6 | 4 | 0 | 0 | 7 | 3 | 0 | 0 |
| | 50 to 69 years old | Male | 5 | 3 | 2 | 0 | 5 | 3 | 1 | 0 |
| | | Female | 6 | 4 | 0 | 0 | 6 | 4 | 0 | 0 |
| Example 6 | 10 to 29 years old | Male | 6 | 3 | 1 | 0 | 5 | 3 | 1 | 1 |
| | | Female | 6 | 2 | 1 | 1 | 6 | 2 | 1 | 1 |
| | 30 to 49 years old | Male | 5 | 3 | 1 | 1 | 6 | 3 | 1 | 0 |
| | | Female | 5 | 3 | 2 | 0 | 6 | 2 | 2 | 0 |
| | 50 to 69 years old | Male | 5 | 2 | 1 | 2 | 5 | 3 | 1 | 1 |
| | | Female | 4 | 3 | 2 | 1 | 5 | 2 | 2 | 1 |
| Example 7 | 10 to 29 years old | Male | 1 | 3 | 3 | 3 | 2 | 2 | 4 | 2 |
| | | Female | 0 | 2 | 4 | 4 | 1 | 3 | 4 | 2 |
| | 30 to 49 years old | Male | 0 | 2 | 4 | 4 | 1 | 3 | 3 | 3 |
| | | Female | 0 | 2 | 3 | 5 | 1 | 4 | 2 | 3 |
| | 50 to 69 years old | Male | 1 | 3 | 3 | 3 | 2 | 3 | 2 | 3 |
| | | Female | 0 | 3 | 4 | 3 | 1 | 4 | 3 | 2 |

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An illumination system comprising a plurality of white light sources that satisfies a relationship of $$-0.2 \leq [(2(\lambda) \times V(\lambda))/(P(\lambda \max 1) \times V(\lambda \max 1)) - (B(\lambda) \times V(\lambda))/(B(\lambda \max 2) \times V(\lambda \max 2))] \leq +0.2$$

where $P(\lambda)$ is an emission spectrum of a white light source having a specific color temperature on a black-body locus, $B(\lambda)$ is an emission spectrum of black body radiation having a corresponding color temperature, $V(\lambda)$ is a spectrum of spectral luminous efficiency, $\lambda \max 1$ is a wavelength at which $2(\lambda) \times V(\lambda)$ becomes maximum, and $\lambda \max 2$ is a wavelength at which $B(\lambda) \times V(\lambda)$ becomes maximum, wherein the respective white light sources are the white light sources that have different color temperatures, and light from the respective white light sources is irradiated from different directions to a target.

2. The illumination system of claim 1, wherein the plurality of white light sources are the plurality of white light sources that irradiate the light from a position higher than the target in front of the target, and the following Equation (1) or the following Equation (2) are satisfied:

$$0 < L1 < 3LM \text{ (where, } LM \geq A) \tag{1}$$

$$0 < L1 \text{ (where, } LM < A) \tag{2}$$

where L1 is a straight line distance between light emitting surfaces of any two of the plurality of white light sources, C1 is a middle point of a straight line distance between two light sources positioned to be spaced apart from each other by the farthest distance, A is a length of one side in a horizontal direction of a right angle quadrilateral which is circumscribed, at the most points, to a contour of a plane shape of the target drawn in a front view at the time of converting the target into a two-dimensional image by a front projection view, X is an intersection point between two diagonal lines of the right angle quadrilateral, and LM is a straight line distance between the intersection point X and the middle point C1.

3. The illumination system configured by a combination of the illumination system of claim 2 and a plurality of white light sources.

4. The illumination system of claim 1, wherein the plurality of white light sources are the plurality of white light sources that irradiate the light from a position lower than the target in front of the target, and the following Equation (3) and the following Equation (4) are satisfied:

$$0 < L2 < 3LN \text{ (where, } LN \geq A) \tag{3}$$

$$0 < L2 \text{ (where, } LN < A) \tag{4}$$

where L2 is a straight line distance between light emitting surfaces of any two of the plurality of white light sources, C2 is a middle point of a straight line distance between two light sources positioned to be spaced apart from each other by the farthest distance, A is a length of one side in a horizontal direction of a right angle quadrilateral which is circumscribed, at the most points, to a contour of a plane shape of the target drawn in a front view at the time of converting the target into a two-dimensional image by a front projection view, X is an intersection point between two diagonal lines of the right angle quadrilateral, and LN is a distance between the intersection point X and the middle point C2.

5. The illumination system of claim 1, wherein the color temperatures of the white light sources are 2200 K or more to 8000 K or less.

6. The illumination system of claim 5, wherein the color temperatures of the white light sources are 2200 K or more to 6500 K or less.

7. The illumination system of claim 1, wherein a difference in a color temperature between the respective white light sources is 100 K or more.

8. The illumination system of claim 1, wherein the white light sources include at least light emitting diodes (LEDs) and phosphors, and the phosphors are mixed with a resin to form phosphor layers.

9. The illumination system of claim 8, wherein in the white light sources in which the LEDs emit ultraviolet to violet primary light having a peak wavelength of 350 nm to 420 nm and the phosphor layers formed to cover the LEDs, absorb the primary light from the LED and emit white secondary light, an intensity of the primary light of the LED leaked from each of the white light sources is 0.4 mW/lm or less.

10. The illumination system of claim 1, wherein the white light sources include two or more types to five or less types of white light sources.

11. The illumination system of claim 1, wherein the illumination system is used for illumination of an art craftwork exhibited in an art gallery or a museum.

12. The illumination system of claim 1, further comprising a controller that controls irradiation of light to the target.

13. An illumination system for illuminating a target, comprising:
at least a first light source and a second light source,
wherein the first light source and the second light source are configured so that a light component included in a luminous flux from the first light source and a corresponding light component included in a luminous flux from the second light source form different angles in a specific region on a surface of the target,
emission spectra $P_1(\lambda)$ and $P_2(\lambda)$ of each of the first light source and the second light source have different color temperatures and satisfy conditions of the following Equations, respectively, $$-0.2 \leq [(P_1(\lambda) \times V(\lambda))/(P_1(\lambda\ max\ 1) \times V(\lambda\ max\ 1)) - (B_1(\lambda) \times V(\lambda))/(B_1(\lambda\ max\ 2) \times V(\lambda\ max\ 2))] \leq +0.2$$

$$-0.2 [(P_2(\lambda) \times V(\lambda))/(P_2(\lambda\ max\ 1) \times V(\lambda\ max\ 1)) - (B_2(\lambda) \times V(\lambda))/(B_2(\lambda\ max\ 2) \times V(\lambda\ max\ 2))] \leq +0.2,$$

wherein $B_1(\lambda)$ and $B_2(\lambda)$ are emission spectra of black body radiation showing the same color temperatures as those of the first light source and the second light source, respectively, and $V(\lambda)$ is a spectrum of spectral luminous efficiency, and $\lambda$ is a wavelength, $\lambda$max 1 is a wavelength at which $P_1(\lambda) \times V(\lambda)$ or $P_2(\lambda) \times V(\lambda)$ becomes maximum, and $\lambda$ max 2 is a wavelength at which $B_1(\lambda) \times V(\lambda)$ or $B_2(\lambda) \times V(\lambda)$ becomes maximum.

14. The illumination system of claim 13, further comprising a controller that controls irradiation of light to the target.

15. An illumination method for illuminating a target,
wherein a first light source and a second light source are arranged so that a light component included in a luminous flux from the first light source and a corresponding light component included in a luminous flux from the second light source form different angles in a specific region on a surface of the target,
emission spectra $P_1(\lambda)$ and $P_2(\lambda)$ of each of the first light source and the second light source have different color temperatures and satisfy conditions of the following Equations, respectively, $$-0.2 \leq [(P_1(\lambda) \times V(\lambda))/(P_1(\lambda\ max\ 1) \times V(\lambda\ max\ 1)) - (B_1(\lambda) \times V(\lambda))/(B_1(\lambda\ max\ 2) \times V(\lambda\ max\ 2))] \leq +0.2$$

$$-0.2 \leq [(P_2(\lambda) \times V(\lambda))/(P_2(\lambda\ max\ 1) \times V(\lambda\ max\ 1)) - (B_2(\lambda) \times V(\lambda))/(B_2(\lambda\ max\ 2) \times V(\lambda\ max\ 2))] \leq +0.2,$$

wherein $B_1(\lambda)$ and $P_2(\lambda)$ are emission spectra of black body radiation showing the same color temperatures as those of the first light source and the second light source, respectively, and $V(\lambda)$ is a spectrum of spectral luminous efficiency, and $\lambda$ is a wavelength, $\Delta$max 1 is a wavelength at which $P_1(\lambda) \times V(\lambda)$ or $P_2(\lambda) \times V(\lambda)$ becomes maximum, and $\lambda$ max 2 is a wavelength at which $B_1(\lambda) \times V(\lambda)$ or $B_2(\lambda) \times V(\lambda)$ becomes maximum.

* * * * *